United States Patent
Redepenning et al.

(10) Patent No.: US 9,558,929 B2
(45) Date of Patent: Jan. 31, 2017

(54) POLYMER ON GRAPHENE

(71) Applicant: NUtech Ventures, Lincoln, NE (US)

(72) Inventors: Jody G. Redepenning, Lincoln, NE (US); Alexander Sinitskii, Lincoln, NE (US); Benjamin Wymore, Lincoln, NE (US)

(73) Assignee: NUtech Ventures, Lincoln, NE (US)

( * ) Notice: Subject to any disclaimer, the term of this patent is extended or adjusted under 35 U.S.C. 154(b) by 0 days.

(21) Appl. No.: 14/554,000

(22) Filed: Nov. 25, 2014

(65) Prior Publication Data

US 2015/0170906 A1 Jun. 18, 2015

Related U.S. Application Data

(60) Provisional application No. 61/908,231, filed on Nov. 25, 2013.

(51) Int. Cl.
| | |
|---|---|
| *H01L 21/02* | (2006.01) |
| *H01L 29/51* | (2006.01) |
| *H01L 29/786* | (2006.01) |
| *H01L 29/66* | (2006.01) |
| *H01L 29/16* | (2006.01) |
| *H01L 29/423* | (2006.01) |
| *H01L 29/49* | (2006.01) |

(52) U.S. Cl.
CPC ... *H01L 21/02118* (2013.01); *H01L 21/02282* (2013.01); *H01L 29/1606* (2013.01); *H01L 29/42364* (2013.01); *H01L 29/4908* (2013.01); *H01L 29/51* (2013.01); *H01L 29/66045* (2013.01); *H01L 29/66742* (2013.01); *H01L 29/78684* (2013.01); *H01L 21/0262* (2013.01); *H01L 21/02425* (2013.01); *H01L 21/02527* (2013.01)

(58) Field of Classification Search
CPC ........ H01L 29/24; H01L 29/51; H01L 29/786; H01L 29/1606; H01L 21/02; H01L 21/02118; H01L 21/02282; H01L 29/66045; H01L 29/66742; H01L 29/42364; H01L 29/78684; H01L 29/4908
See application file for complete search history.

(56) References Cited

U.S. PATENT DOCUMENTS

| | | | | |
|---|---|---|---|---|
| 2010/0108529 | A1* | 5/2010 | Zamborini | G01N 33/005 205/205 |
| 2010/0283054 | A1* | 11/2010 | Hirano | H01L 29/78603 257/57 |

(Continued)

OTHER PUBLICATIONS

Alaboson et al., "Seeding Atomic Layer Deposition of High-k Dielectrics on Epitaxial Graphene with Organic Self-Assembled Monolayers," ACS Nano., Jun. 28, 2011;5(6):5223-32. doi: 10.1021/nn201414d. Epub May 12, 2011.

(Continued)

*Primary Examiner* — Fazli Erdem
(74) *Attorney, Agent, or Firm* — Fish & Richardson P.C.

(57) ABSTRACT

A top-gated graphene field effect transistor can be fabricated by forming a layer of graphene on a substrate, and applying an electrochemical deposition process to deposit a layer of dielectric polymer on the graphene layer. An electric potential between the graphene layer and a reference electrode is cycled between a lower potential and a higher potential. A top gate is formed above the polymer.

26 Claims, 12 Drawing Sheets

(56) References Cited

U.S. PATENT DOCUMENTS

| | | | | |
|---|---|---|---|---|
| 2012/0058350 | A1* | 3/2012 | Long | B82Y 10/00 428/446 |
| 2012/0313079 | A1* | 12/2012 | Song | H01L 29/1606 257/29 |
| 2013/0018599 | A1* | 1/2013 | Peng | B82Y 15/00 702/30 |
| 2013/0032797 | A1* | 2/2013 | Hirano | H01L 29/7869 257/43 |
| 2013/0313522 | A1* | 11/2013 | Nourbakhsh | H01L 29/1606 257/29 |
| 2014/0070170 | A1* | 3/2014 | Andersson | G01N 27/4146 257/29 |
| 2015/0109606 | A1* | 4/2015 | Peale | H01L 31/1136 356/30 |
| 2015/0137075 | A1* | 5/2015 | Heo | H01L 27/0922 257/29 |
| 2015/0273737 | A1* | 10/2015 | Chen | B29C 41/22 428/336 |
| 2015/0364472 | A1* | 12/2015 | Kim | H01L 27/0922 257/29 |

OTHER PUBLICATIONS

Babai et al., "Ellipsometric study of the polymeric surface films formed on platinum electrodes by the electrooxidation of phenolic compounds," Surf. Sci., 1980, 96, 461-475.

Bae et al., Roll-to-roll production of 30-inch graphene films for transparent electrodes, Nat Nanotechnol., 2010, 5(8):574-8. doi: 10.1038/nnano.2010.132. Epub Jun. 20, 2010.

Bai et al., "Graphene Nanomesh," Nat Nanotechnol., 2010, 5(3):190-4. doi: 10.1038/nnano.2010.8. Epub Feb. 14, 2010.

Banerjee et al., "Bilayer PseudoSpin Field-Effect Transistor (BiSFET): A Proposed New Logic Device," Electron Device Letters, IEEE, 2009, 30.2:158-160.

Besenhard et al., "Preparation and Characterization of Graphite Compounds by Electrochemical Techniques," J. Synth. Met., 1981, 3(3-4):187-194.

Chailapakul et al., "Interactions between Organized, Surface-Confined Monolayers and Liquid-Phase Probe Molecules. 4. Synthesis and Characterization of Nanoporous Molecular Assemblies: Mechanism of Probe Penetration," Langmuir, 1995, 11.4:1329-1340.

Chen et al., "Charged-impurity scattering in graphene," Nat. Phys., 2008, 4, 377-381.

Chen et al., "Ionic Screening of Charged-Impurity Scattering in Graphene," Nano Lett., 2009, 9(4):1621-5. doi: 10.1021/n1803922m.

Cheng et al., "Toward Intrinsic Graphene Surfaces: A Systematic Study on Thermal Annealing and Wet-Chemical Treatment of SiO2-Supported Graphene Devices," Nano Lett., 2011, 11:767-771.

Cordero et al., "The interaction of sulfuric acid with graphene and formation of adsorbed crystals," Nanotech., 2007, 18:1-7.

Duan et al., "Study on electrochemical oxidation of 4-Chlorophenol on a vitreous carbon electrode using cyclic voltammetry," Electrochim Acta, 2013, 94:192-197.

Eisenstein et al., "Bose—Einstein condensation of excitons in bilayer electron systems," Nature, 2004, 432(7018):691-4.

Farmer et al., "Utilization of a Buffered Dielectric to Achieve High Field-Effect Carrier Mobility in Graphene Transistors," Nano Lett., 2009, 9(12):4474-8. doi: 10.1021/n1902788u.

Ferrari et al., "Raman Spectrum of Graphene and Graphene Layers," Phys Rev Lett., 2006, 97(18):187401. Epub Oct. 30, 2006.

Finklea et al., "Passivation of Pinholes in Octadecanethiol Monolayers on Gold Electrodes by Electrochemical Polymerization of Phenol," Langmuir, 1990, 6(2):371-376.

Fuhrer et al., "Measurement of mobility in dual-gated MoS2 transistors," Nat Nanotechnol., 2013, 8(3):146-7. doi: 10.1038/nnano.2013.30.

Garces et al., "Graphene functionalization and seeding for dielectric deposition and device integration," Journal of Vacuum Science & Technology B, 2012, 30.3: 030801.

Gattrell et al., "A Study of Electrode Passivation during Aqueous Phenol Electrolysis," J. Electrochem. Soc., 1993, 140(4):903-911.

Ishigami et al., "Atomic Structure of Graphene on SiO2," Nano Lett., 2007, 7(6):1643-1648.

Jeong et al., "Improved transfer of chemical-vapor-deposited graphene through modification of intermolecular interactions and solubility of poly(methylmethacrylate) layers," Carbon, 2014, 66:612-618.

Kim et al., "Realization of a high mobility dual-gated graphene field-effect transistor with Al2O3 dielectric," arXiv preprint arXiv, 2009:0901.2901.

Lee et al., "Characteristics of high-k Al2O3 dielectric using ozone-based atomic layer deposition for dual-gated graphene devices," Applied Physics Letters, 2010, 97.4:3107.

Lee et al., "Conformal Al2O3 dielectric layer deposited by atomic layer deposition for graphene-based based nanoelectronics," Applied Physics Letters, 2008, 92.20:203102.

Lemme et al., "A Graphene Field-Effect Device," arXiv preprint cond-mat/0703208 2007.

Li et al., "Large-Area Synthesis of High-Quality and Uniform Graphene Films on Copper Foils," Science, 2009, 324(5932):1312-4. doi: 10.1126/science.1171245. Epub May 7, 2009.

Lin et al., "100-GHz Transistors from Wafer-Scale Epitaxial Graphene," Science, 2010, 327(5966):662. doi: 10.1126/science.1184289.

Lin et al., "Clean Transfer of Graphene for Isolation and Suspension," ACS Nano, 2011, 5(3):2362-8. doi: 10.1021/nn200105j. Epub Feb. 25, 2011.

Lin et al., "Operation of Graphene Transistors at Gigahertz Frequencies," Nano Lett., 2009, 9(1):422-6. doi: 10.1021/n1803316h.

Lipatov et al., "Intrinsic device-to-device variation in graphene field-effect transistors on a Si/SiO2 substrate as a platform for discriminative gas sensing," Applied Physics Letters, 2014, 104.1:013114.

Liu et al., "Electrochemical synthesis of ultrathin-film composite membranes," J. Am. Chem. Soc., 1990, 112(6):2458-2459.

Long et al., "Ultrathin, Protective Coatings of Poly(o-phenylenediamine) as Electrochemical Proton Gates: Making Mesoporous MnO2 Nanoarchitectures Stable in Acid Electrolytes," Nano Lett., 2003, 3:8,1155-1161.

McCarley et al., "Optical, electrical, and electrochemical characteristics of ultrathin poly(phenylene oxide) films: organic dielectrics less than 10 nm thick," Journal of Electroanalytical Chemistry and Interfacial Electrochemistry, 1990, 290.1:79-92.

McCarley et al., "Permeant Molecular Sieving with Electrochemically Prepared 6-nm Films of Poly(phenylene oxide)," J. Phys. Chem., 1991, 95(6):2492-2498.

Mengoli et al., "An Overview of Phenol Eiectropolymerization for Metal Protection," J. Electrochem. Soc., 1987, 134(12):643C-652C.

Meric et al., "Current saturation in zero-bandgap, top-gated graphene field-effect transistors," Nat Nanotechnol., 2008, 3(11):654-9. doi: 10.1038/nnano.2008.268. Epub Sep. 21, 2008.

Metrot et al., "Charge Transfer Reactions During Anodic Oxidation of Graphite in H2SO4," Syn. Metals, 1981, 3:201-207.

Mordi et al., "Low-κ organic layer as a top gate dielectric for graphene field effect transistors," Applied Physics Letters, 2012, 100.19:193117.

Novoselov et al., "Electric Field Effect in Atomically Thin Carbon Films," Science, 2004, 306:666-669.

Novoselov et al., "Two-dimensional atomic crystals," Proc Natl Acad Sci USA, 2005, 102(30):10451-3. Epub Jul. 18, 2005.

Oyama et al., "Anodic Oxidation of 2,6-Dimethylphenol in Various Electrolytic Solutions," J. Electrochem. Soc., 1987, 134(2):3068-3073.

Palacios et al., "Applications of Graphene Devices in RF Communications," IEEE Comm Mag., 2010, 48(6):122-128.

Park et al., "Graphene Gate Electrode for MOS Structure-Based Electronic Devices," Nano Lett., 2001, 11:5383-5386.

(56) References Cited

OTHER PUBLICATIONS

Pirkle et al., "The effect of chemical residues on the physical and electrical properties of chemical vapor deposited graphene transferred to SiO2," Appl. Phys. Lett., 2011, 99:122108-1-122108-3.

Rhodes et al., "Nanoscale Polymer Electrolytes: Ultrathin Electrodeposited Poly(Phenylene Oxide) with Solid-State Ionic Conductivity," The Journal of Physical Chemistry B, 2004,108.35:13079-13087.

Schwierz, "Graphene Transistors," Nat. Nanotech., 2010, 5:487-496.

Shin et al., "Seeding atomic layer deposition of high-k dielectric on graphene with ultmthin poly(4-vinylphenol) layer for enhanced device performance and reliability," Applied Physics Letters, 2012, 101.3:033507.

Sinitskii et al., "Patterning Graphene through the Self-Assembled Templates: Toward Periodic Two-Dimensional Graphene Nanostructures with Semiconductor Properties," J Am Chem Soc., 2010, 132(42):14730-2. doi: 10.1021/ja105426h.

Speck et al., "Atomic layer deposited aluminum oxide films on graphite and graphene studied by XPS and AFM," Physica Status Solidi (c), 2010, 7.2:398-401.

Sumanasekera et al., "Electrochemical Oxidation of Single Wall Carbon Nanotube Bundles in Sulfuric Acid," J. Phys. Chem. B, 1999, 103(21):4292-4297.

Tan et al., "Measurement of Scattering Rate and Minimum Conductivity in Graphene," Phys Rev Lett., 2007, 99(24):246803. Epub Dec. 14, 2007.

Tan et al., "Reactivity of Monolayer Chemical Vapor Deposited Graphene Imperfections Studied Using Scanning Electrochemical Microscopy," Am. Chem. Soc., 2012, 6(4):3070-3079.

Taychatanapat et al., "Electronic Transport in Dual-Gated Bilayer Graphene at Large Displacement Fields," Phys Rev Lett., 2010, 105(16):166601. Epub Oct. 11, 2010.

Wang et al., "Atomic Layer Deposition of Metal Oxides on Pristine and Functionalized Graphene," J. Am. Chem. Soc., 2008, 130:8152-8153.

White et al., "Improvement of Performance of n-WSe Electrodes by Electrochemical Polymerization of o-Phenylenediamine at Surface Imperfections," J. Electrochem. Soc., 1982, 129(2):265-271.

Xu et al., "Graphene Visualizes the First Water Adlayers on Mica at Ambient Conditions," Science, 2010, 329(5996):1188-91. doi: 10.1126/science.1192907.

Yamaguchi et al. "Tunnel spin injection into graphene using $Al_2O_3$ barrier grown by atomic layer deposition on functionalized graphene surface." Journal of Magnetism and Magnetic Materials, 2012, 324.5:849-852.

\* cited by examiner

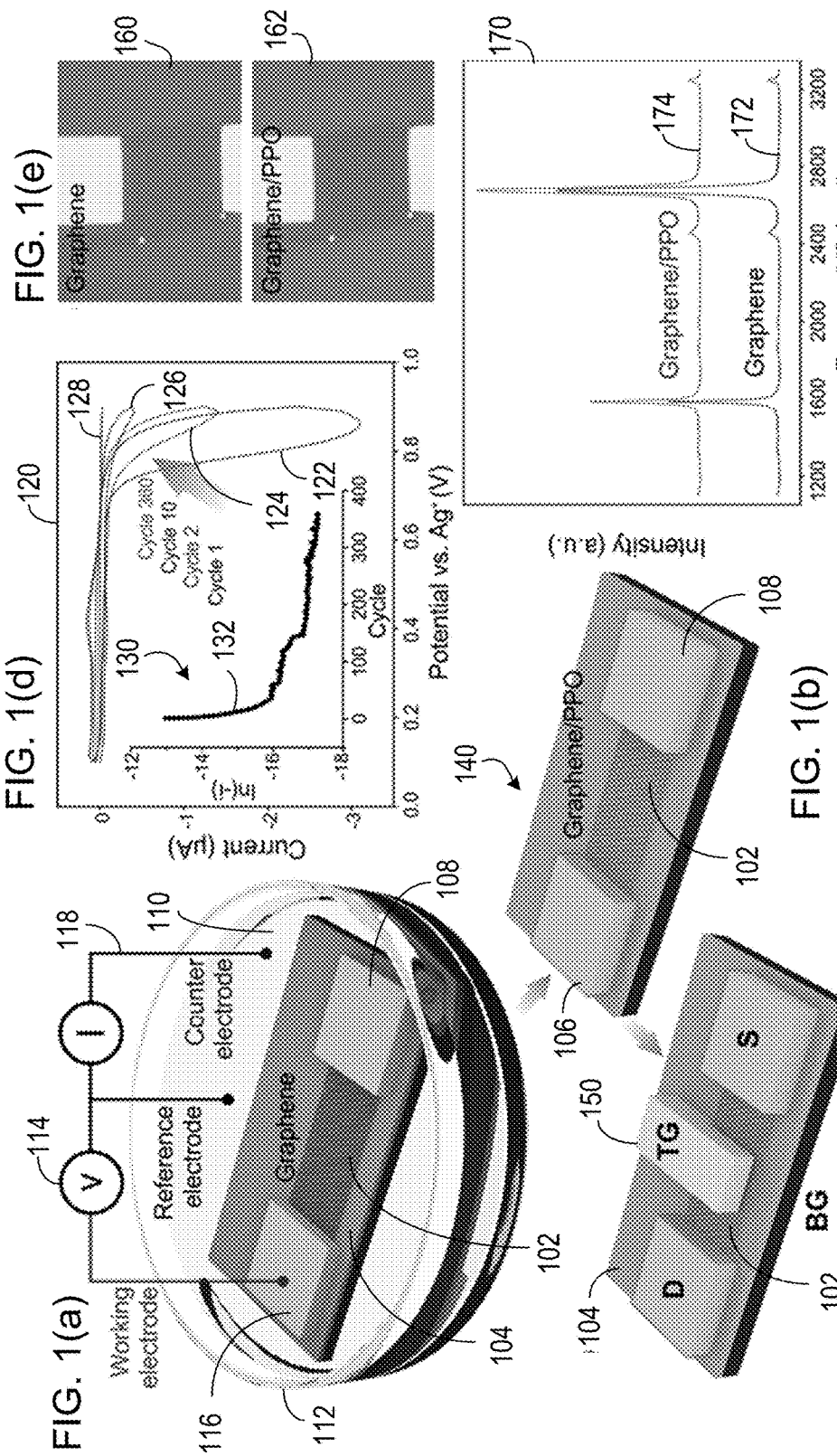

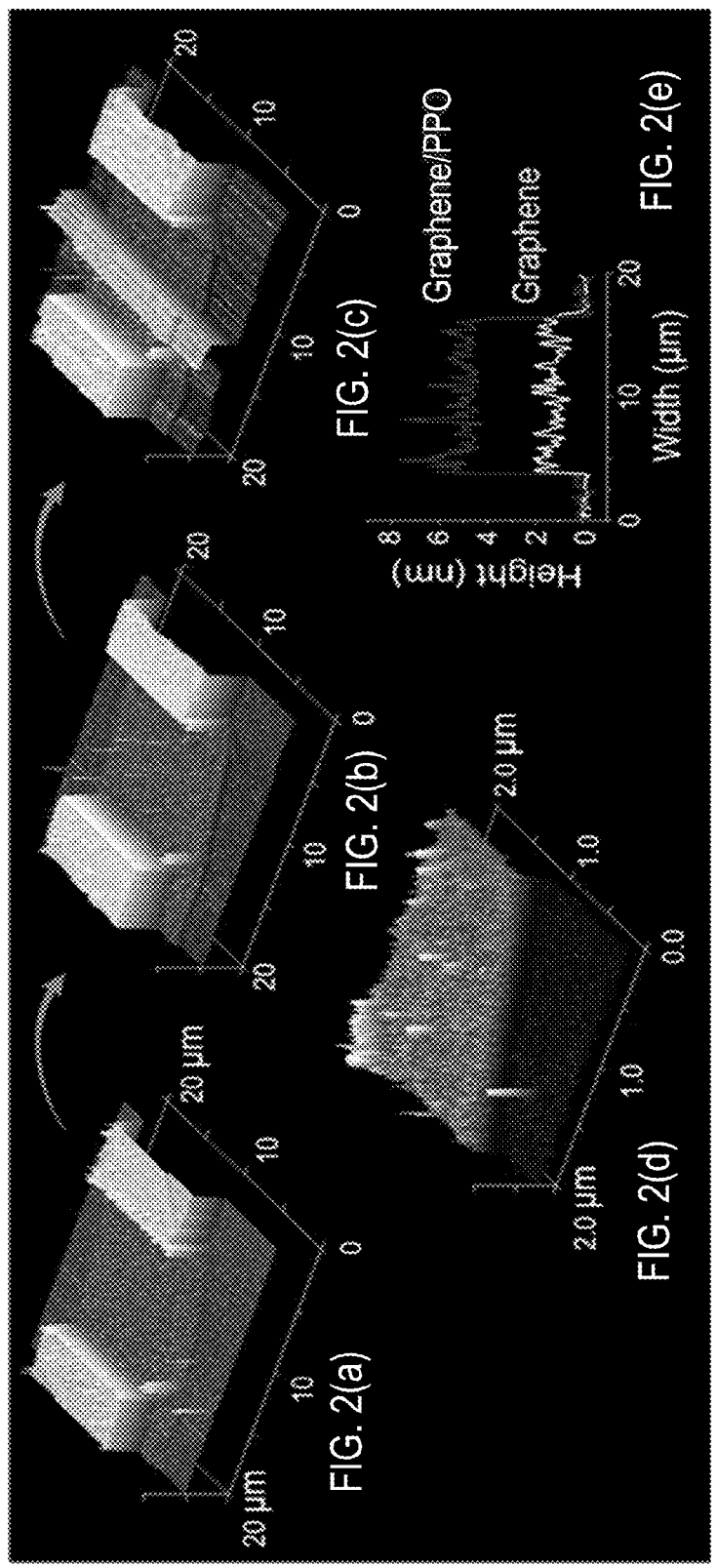

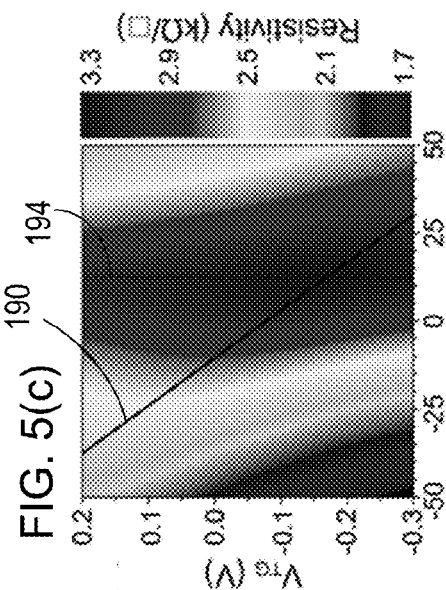
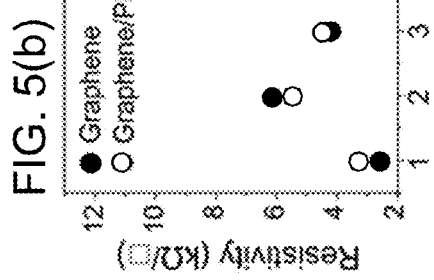
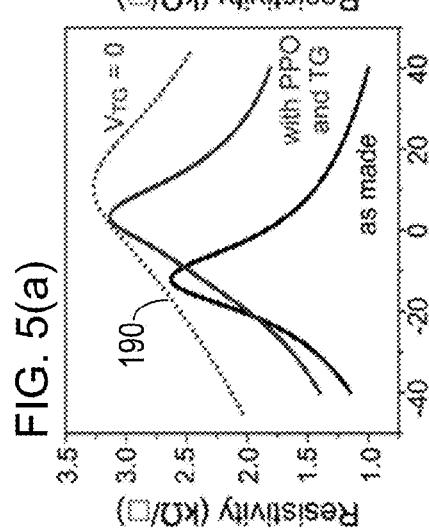
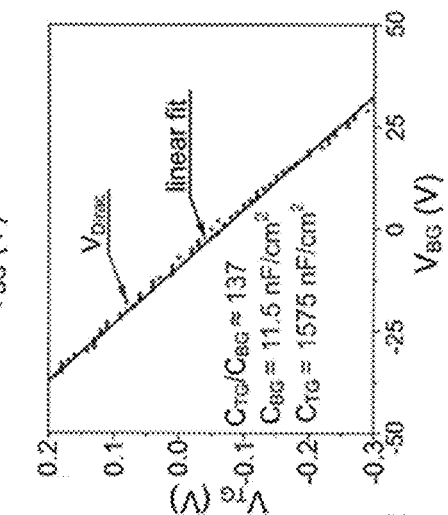
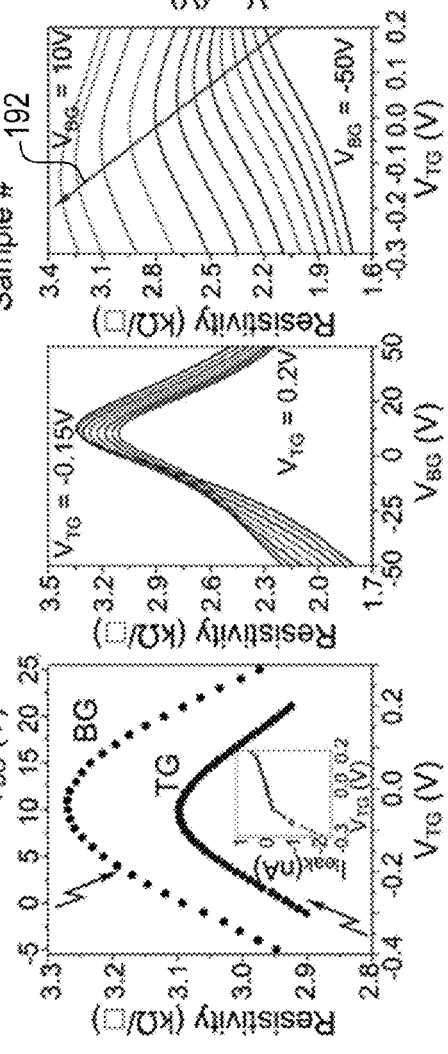
FIG. 5(a) FIG. 5(b) FIG. 5(c)
FIG. 5(d) FIG. 5(e) FIG. 5(f) FIG. 5(g)

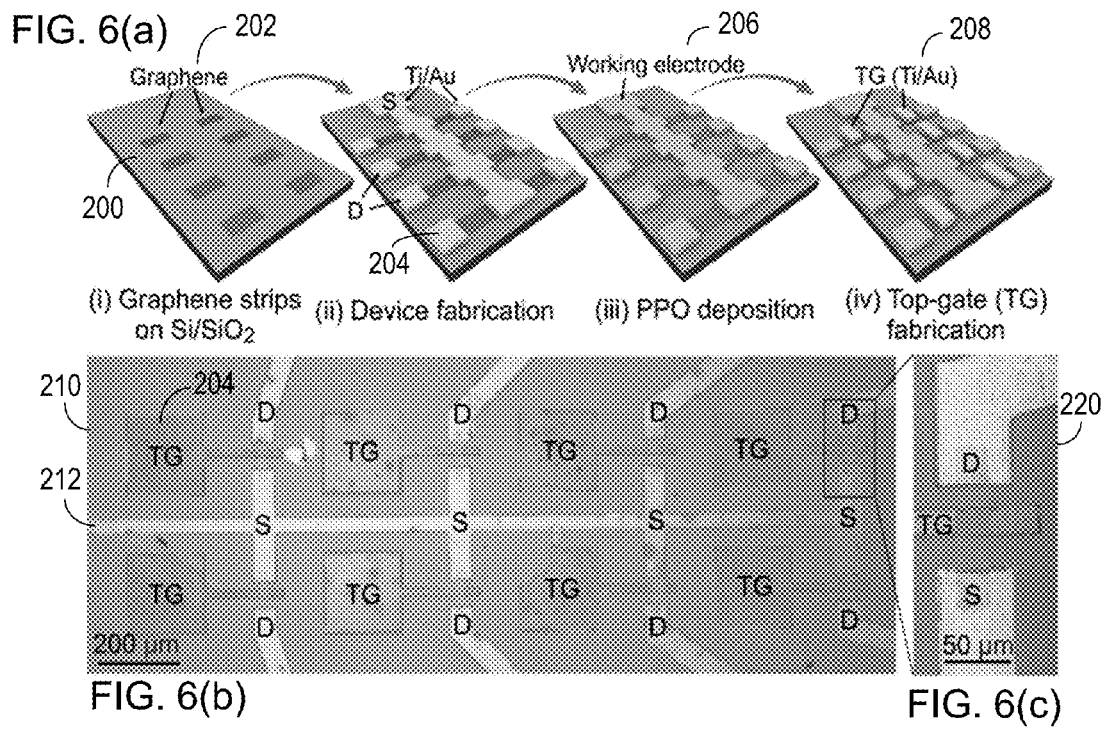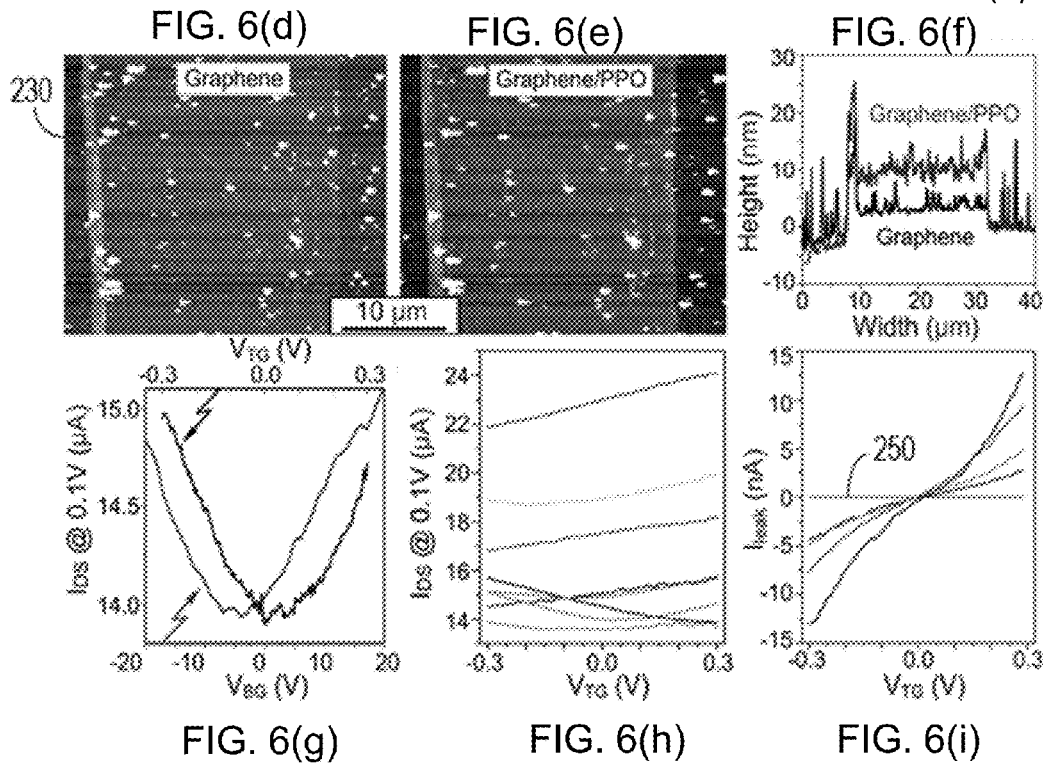
FIG. 6(a)
FIG. 6(b)  FIG. 6(c)
FIG. 6(d)  FIG. 6(e)  FIG. 6(f)
FIG. 6(g)  FIG. 6(h)  FIG. 6(i)

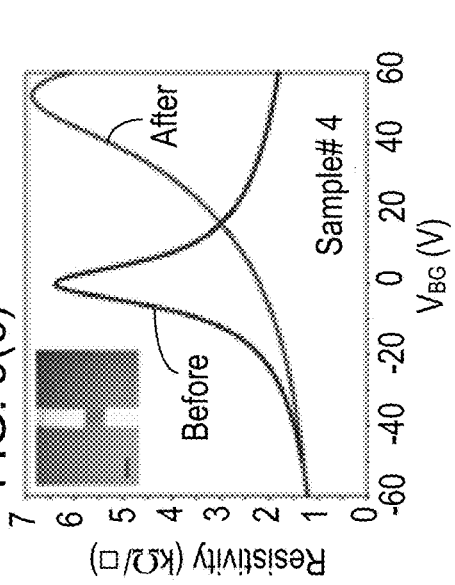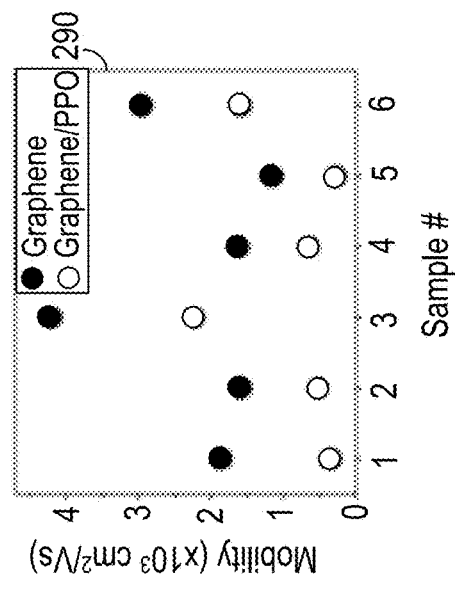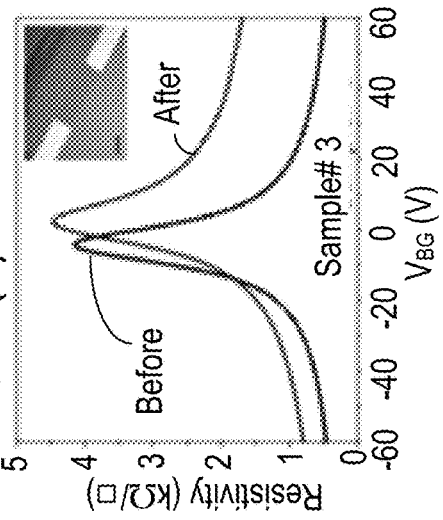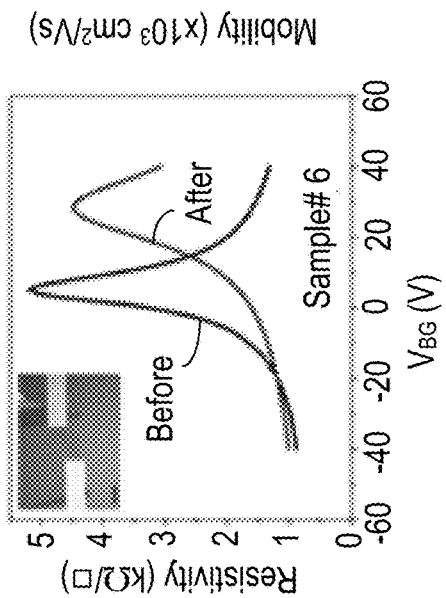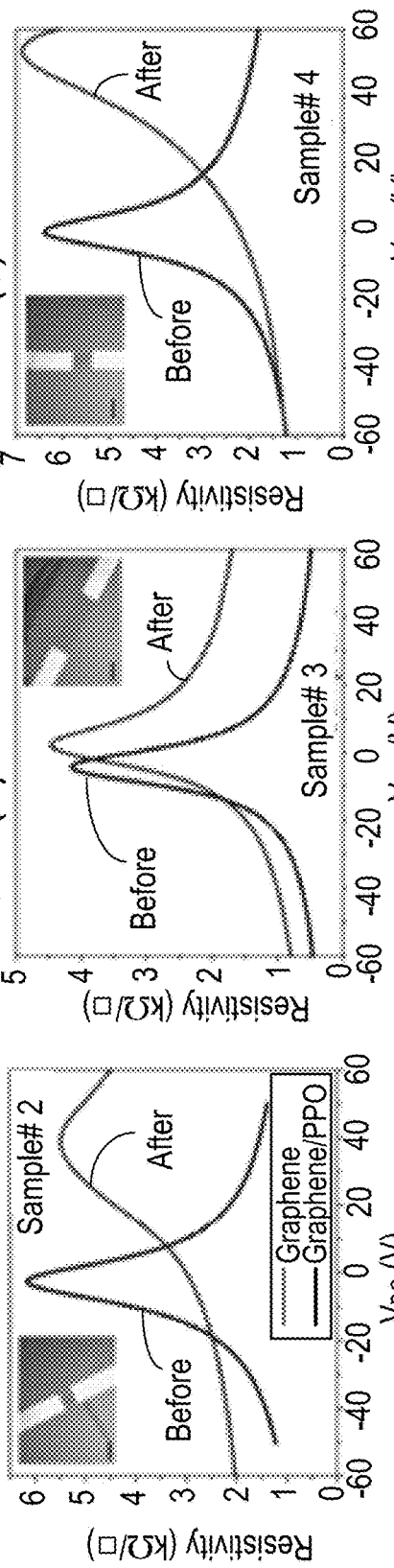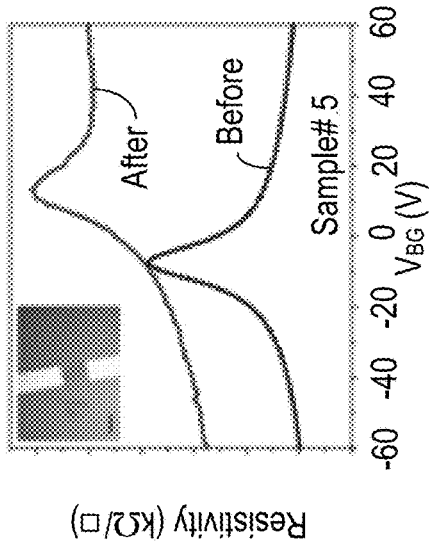
FIG. 9(a) Sample# 2  FIG. 9(b) Sample# 3  FIG. 9(c) Sample# 4
FIG. 9(d) Sample# 5  FIG. 9(e) Sample# 6  FIG. 9(f)

POLYMER ON GRAPHENE

CROSS-REFERENCE TO RELATED APPLICATIONS

This application claims priority to U.S. provisional application 61/908,231, filed on Nov. 25, 2013, incorporated herein by reference in its entirety.

STATEMENT REGARDING FEDERALLY SPONSORED RESEARCH OR DEVELOPMENT

This invention was made with government support under contract DMR0820521 awarded by NSF MRSEC. The government has certain rights in the invention.

TECHNICAL FIELD

This subject matter is generally related to forming a polymer layer on graphene.

BACKGROUND

Graphene has high charge carrier mobilities and can be used to fabricate graphene based field effect transistors (FET). The transistor may have a locally gated (top-gate) electrode on the graphene and may be useful for operating at low power and terahertz frequencies applications, including low noise amplifiers and electromechanical resonators. Ideal dielectric barriers separating the top-gate from the graphene should be thin, free of pinholes, and have uniform thickness.

Construction of a top-gated electrode can be difficult due to the incompatibilities of graphene with typical high dielectric constant (high-κ) barrier preparations. Pristine graphene has few functional groups, which hinders the modification of the surface with precursors commonly used for atomic layer deposition (ALD). The inability to modify the surface with precursors results in non-uniform films that nucleate primarily at the edges and defects of the graphene. Using physical vapor deposition to produce the dielectric film may damage the graphene, and functionalization of the graphene with ozone and/or nitrous oxide may result in non-uniform films or degraded carrier mobilities of the graphene field effect transistor.

SUMMARY

In general, in one aspect, a method of fabricating a graphene transistor is provided. The method includes forming a layer of graphene on a substrate; applying an electrochemical deposition process to deposit a layer of dielectric polymer on the graphene layer; and forming a top gate above the polymer.

Implementations of the method may include one or more of the following features. A potential can be applied between the graphene layer and a reference electrode, and the potential can be cycled between a lower potential and a higher potential. The lower potential can be in a range between 0 to 0.5V, and the higher potential can be in a range between 0.5V to 1.5V. Depositing the layer of dielectric polymer can include depositing poly(phenylene oxide) on the graphene. The method can include patterning the graphene to form a channel, and forming drain and source electrodes that are electrically coupled to the graphene. Applying an electrochemical deposition process can include placing the graphene and the substrate in a solution that includes phenol and sulfuric acid. The method can include forming a layer of second dielectric material on the dielectric polymer layer, the second dielectric material having a dielectric constant that is higher than the dielectric constant of the polymer. Depositing a layer of dielectric polymer can include depositing a layer of dielectric polymer having a thickness that is less than 10 nm.

In general, in another aspect, a method for forming a dielectric polymer layer on a layer of two-dimensional material is provided. The method includes forming a layer of two-dimensional material on a substrate, the two-dimensional material layer having a thickness less than 1 μm; and applying an electro-deposition process to deposit a dielectric polymer layer on the two-dimensional material, in which a rate of deposition of the polymer at a given location of the two-dimensional material decreases as a thickness of the polymer layer increases.

Implementations of the method may include one or more of the following features. In some examples, the two-dimensional material layer can have a thickness less than 100 nm. In some examples, the two-dimensional material layer can have a thickness less than 10 nm. The two-dimensional material can include graphene. The method can include patterning the graphene to form a channel of a field effect transistor, forming drain and source electrodes that are electrically coupled to the graphene, and forming a top gate above the polymer layer. Applying an electro-deposition process can include causing the two-dimensional material to be in contact with a solution that includes phenol and sulfuric acid, and applying a potential between the two-dimensional material and a reference electrode to deposit a layer of poly(phenylene oxide) on the two-dimensional material. Applying a potential can include cycling a potential between the two-dimensional material and a reference electrode between a lower potential and a higher potential, the lower potential being less than 0.5V, and the higher potential being in a range from 0.5V to 1.5V. In some examples, applying the potential can include cycling the potential between the graphene and the reference electrode between about 0.1 V to about 0.9V. Forming a layer of two-dimensional material can include forming a graphene layer having a thickness less than 3 nm, and depositing a polymer layer includes depositing a polymer layer having a thickness less than 10 nm. The method can include forming a layer of dielectric material on the polymer layer, the dielectric material having a dielectric constant that is higher than the dielectric constant of the polymer layer. Forming the layer of dielectric material can include using atomic layer deposition to deposit the layer of dielectric material. The method can include forming pores in the graphene layer when applying the electro-deposition. Applying an electro-deposition process can include electro-polymerizing one or more monomers that include at least one of 4-chlorophenol, 2,6-dimethylphenol, or o-phenylenediamine. Forming a layer of two-dimensional material can include forming a layer of phosphorene. The method can include covering the phosphorene layer with the polymer layer to prevent oxidation of the phosphorene.

In general, in another aspect, a method for forming a layer of polymer of graphene is provided. The method includes forming a layer of two-dimensional material on a substrate; and performing electrochemical polymerization of phenol to form a layer of polymer on the graphene, the polymer comprising poly(phenylene oxide).

Implementations of the method may include one or more of the following features. Forming a layer of two-dimensional material can include forming a layer of graphene. The method can include patterning the graphene to form a channel of a field effect transistor, forming drain and source electrodes on the graphene, and forming a top gate on the polymer layer. Performing electrochemical polymerization of phenol can include applying an alternating voltage or current to a solution that includes phenol and sulfuric acid. The method can include forming a layer of dielectric material on the polymer layer, the dielectric material having a dielectric constant that is higher than the dielectric constant of the polymer layer. Forming a layer of two-dimensional material can include forming a layer of phosphorene.

In general, in another aspect, a graphene transistor includes a substrate; a layer of graphene on the substrate; a layer of dielectric polymer that includes poly(phenylene oxide) on the graphene layer; and a top gate above the polymer.

Implementations of the transistor may include one or more of the following features. The graphene layer can be patterned to form a channel, and the transistor further includes drain and source electrodes that are electrically coupled to the graphene. The transistor can include a layer of second dielectric material on the dielectric polymer layer, the second dielectric material having a dielectric constant that is higher than the dielectric constant of the polymer. In some examples, the dielectric polymer layer can have a thickness in a range between 500 nm to 1 μm. In some examples, the dielectric polymer layer can have a thickness in a range between 100 nm to 500 nm. In some examples, the dielectric polymer layer can have a thickness in a range between 10 nm to 100 nm. In some examples, the dielectric polymer layer can have a thickness that is less than 10 nm.

In general, in another aspect, an apparatus includes a substrate; a layer of two-dimensional material on the substrate; and a layer of polymer on the graphene, the polymer that includes poly(phenylene oxide).

Implementations of the apparatus may include one or more of the following features. The two-dimensional material can include graphene. The apparatus can include a drain electrode, a source electrode, and a top gate, in which the layer of graphene can be disposed between the drain and source electrodes and function as a channel, and the top gate can be disposed above the layer of polymer. The apparatus can include a dielectric layer disposed between the polymer layer and the top gate. The dielectric layer can include a dielectric that has a dielectric constant that is higher than the dielectric constant of the polymer. The layer of graphene can include a monolayer of graphene. The polymer layer can have a thickness less than 10 nm. The two-dimensional material can include phosphorene. The polymer layer can cover the phosphorene to prevent oxidation of the phosphorene.

In general, in another aspect, an apparatus includes a substrate; and a layer of two-dimensional material on the substrate, in which the two-dimensional material is at least one of a conducting or a semiconducting material. The apparatus includes a dielectric polymer formed on the layer of two-dimensional material by applying an electrochemical deposition process to deposit the dielectric polymer on the two-dimensional material, in which a rate of deposition of the dielectric polymer at a given location of the two-dimensional material decreases as a thickness of the dielectric polymer layer increases.

Implementations of the apparatus may include the following feature. The dielectric polymer can include poly(phenylene oxide).

In general, in another aspect, a method includes applying electrochemical polymerization to deposit a pinhole free, insulating, thin organic film on a conducting or semiconducting surface.

Implementations of the method may include one or more of the following features. The film can be deposited on a carbon substrate. The carbon substrate can include graphene.

BRIEF DESCRIPTION OF DRAWINGS

FIG. 1(a) is a schematic diagram of fabrication of a top-gated graphene field effect transistor by electropolymerization of phenol using graphene as a working electrode.

FIG. 1(b) is a diagram showing a device covered with a thin poly(phenylene oxide) layer.

FIG. 1(c) is a diagram showing fabrication of a top gate over the poly(phenylene oxide) layer.

FIG. 1(d) is a graph showing cyclic voltammetry of poly(phenylene oxide) deposition on a graphene device.

FIG. 1(e) show optical microscopy images of a graphene FET before and after poly(phenylene oxide) deposition.

FIG. 1(f) is a graph showing Raman spectroscopy of the same monolayer graphene before and after poly(phenylene oxide) deposition.

FIG. 2(a) is an atomic force microscopy image of a graphene field effect transistor device after fabrication of source and drain electrodes.

FIG. 2(b) is an atomic force microscopy image of the graphene field effect transistor device after poly(phenylene oxide) electrodeposition.

FIG. 2(c) is an atomic force microscopy image of the graphene field effect transistor device after top gate fabrication.

FIG. 2(d) is a magnified atomic force microscopy image of a graphene edge after poly(phenylene oxide) electrodeposition.

FIG. 2(e) is a graph showing height profiles of graphene before and after poly(phenylene oxide) deposition.

FIG. 5(a) is a graph showing graphene resistivity as a function of $V_{BG}$ before and after poly(phenylene oxide) deposition and top-gate electrode fabrication.

FIG. 5(b) is a graph showing resistivity at $V_{Dirac}$ for six graphene FETs before and after poly(phenylene oxide) deposition.

FIG. 5(c) is a graph showing resistivity of graphene FET with applied top and bottom gates.

FIG. 5(d) is a graph showing a comparison of resistivity plots for a double-gated graphene FET measured as a function of the $V_{TG}$ with $V_{BG}=0$, and measured as a function of the $V_{BG}$ with $V_{TG}=0$.

FIG. 5(e) is a graph showing dependences of graphene FET resistivity on the $V_{BG}$ measured at different $V_{TG}$.

FIG. 5(f) is a graph showing dependences of graphene FET resistivity on the top-gate voltages measured at different $V_{BG}$.

FIG. 5(g) is a graph showing dependence of $V_{Dirac}$ on $V_{TG}$ and $V_{BG}$.

FIG. 6(a) is a schematic diagram of process for fabrication of an array of double-gated graphene FETs.

FIG. 6(b) is an optical photograph of the graphene FET array.

FIG. 6(c) is an optical photograph of one of the devices in the FET array.

FIGS. 6(d) and 6(e) are atomic force microscopy images of the graphene device channel before (d) and after (e) poly(phenylene oxide) electrodeposition.

FIG. 6(f) is a graph showing representative height profiles for the atomic force microscopy images shown in FIGS. 6(d) and 6(e).

FIG. 6(g) is a graph showing a comparison of transfer characteristics for one double-gated graphene FET in the array measured when only one gate voltage (top or bottom) is applied.

FIG. 6(h) is a graph showing $I_{DS}$-$V_{TG}$ dependencies for eight graphene FETs shown in FIG. 6(b).

FIG. 6(i) is a graph showing dependences of the top-gate leakage current on $V_{TG}$ for five double-gated graphene FETs in the array.

FIGS. 9(a) to 9(e) show optical images and transfer characteristics for 5 devices before and after poly(phenylene oxide) deposition.

FIG. 9(f) is a graph showing mobility values for graphene devices presented in FIGS. 6(a) to 6(c) as well as sample #1 in FIG. 5 before and after poly(phenylene oxide) deposition.

DETAILED DESCRIPTION

Figures 3A, 3B:
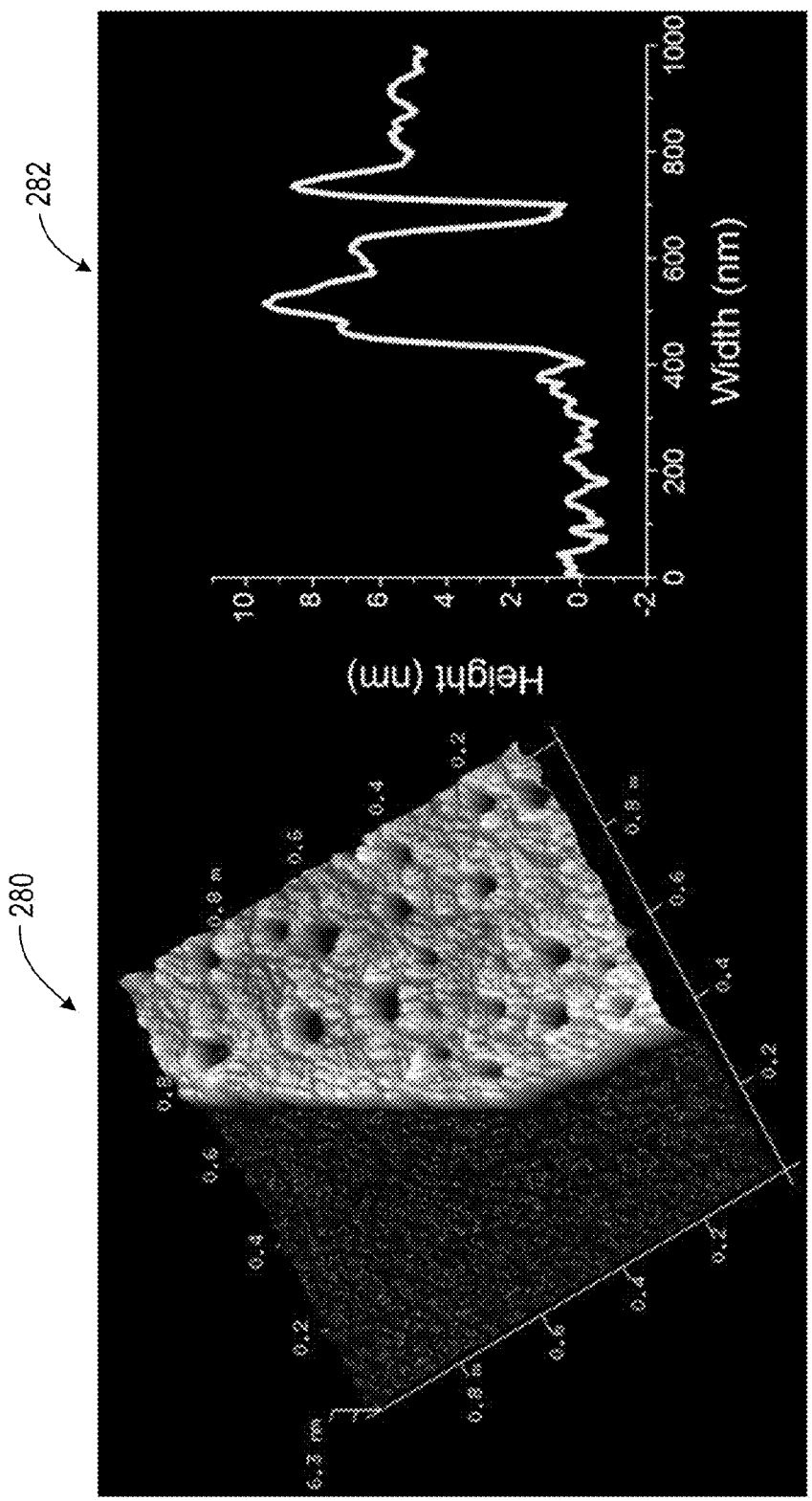
FIG. 3(a) is an atomic force microscopy image of a graphene layer covered by a layer of poly(phenylene oxide) that has holes.
FIG. 3(b) is a graph showing a height profile of the graphene/poly(phenylene oxide) layers of FIG. 3(a).

This document describes a process for fabricating a top-gate graphene transistor that has a thin layer of poly(phenylene oxide) (PPO) as the top gate dielectric or a portion of the top gate dielectric. Electropolymerization of poly(phenylene oxide) is achieved by applying an electrochemical deposition process using a solution that includes phenol and sulfuric acid, in which to electro-oxidization of phenol produces the non-conducting poly(phenylene oxide) on a graphene layer. In some implementations, the poly(phenylene oxide) layer can function as a seed layer or buffer layer for depositing a layer of high-κ dielectric material, in which the combination of the poly(phenylene oxide) layer and the layer of high-κ dielectric material together form the top gate dielectric. The poly(phenylene oxide) formed by the electrochemical deposition process can be thin, e.g., having a thickness less than 10 nm, free of pinholes, and have a uniform thickness.

In the past, it has been difficult to form a dielectric film on graphene because a graphene layer is very thin, and the process of forming the dielectric film often damages the graphene layer and may even cause delamination of the graphene from the substrate. The electrochemical deposition process described here overcomes the past difficulties, in which poly(phenylene oxide) is formed on the graphene layer without damaging the graphene or causing delamination.

The electrochemical deposition process can be used to deposit other dielectric polymers on graphene. The electrochemical deposition process can be used to deposit dielectric polymers on other two-dimensional materials, such as phosphorene. The electrochemical deposition process can also be used to deposit dielectric polymers on other structures, such as carbon nanotubes.

Using electrochemical deposition to deposit a thin dielectric polymer layer has several advantages. The process is simple and can be performed at room temperature. The film thickness can be easily controlled by controlling the charges passed through the working electrode and/or the electric potential at which the deposition is performed. An important feature of this process is that the thickness of electropolymerized insulating films is self-limiting because the rate constant for polymerization rapidly decreases as the film thickness increases. This has a "self-leveling" effect in which when there is uneven thickness in the polymer layer, deposition of the polymer occurs faster at the thinner portions and slower at the thicker portions, eventually forming a substantially smooth and even layer.

Electropolymerization provides some degree of dimensional specificity because film growth can be localized to the conductive substrates that are electronically attached to the potentiostat/galvanostat, leaving adjacent nonconductive materials uncovered by the polymer film. Additionally, electrodeposited polymer films can conform to three dimensional structures, including non-line-of-sight geometries.

As described above, the electropolymerized insulating film can be used as a buffer layer or seed layer for forming another film that may otherwise be difficult to form on graphene directly. For example, it may be difficult to form a dielectric layer made of a high-k material directly on graphene. A thin polymer film made of a low-κ material, e.g., poly(phenylene oxide), can be formed on the graphene by electrochemical deposition, then the layer of high-κ dielectric material may be formed on the low-κ polymer film. The high-κ dielectric material may be formed using, e.g., atomic layer deposition (ALD).

The electro-oxidation of phenol to poly(phenylene oxide) can lead to effective passivation of conducting surfaces, including surfaces of the graphene layer and the drain and source electrodes. The conductivity and dielectric strength of poly(phenylene oxide) films prepared by electropolymerization can be on the order of $7 \times 10^{-12}$ S/cm and $1.7 \times 10^6$ V/cm, respectively. The thickness of the poly(phenylene oxide) layer formed by electropolymerization can be thin, e.g., less than 10 nm, and free of pinholes. The dielectric constant of poly(phenylene oxide) can be as large as 2.98.

The following describes a process for fabricating a top-gate graphene field effect transistor. Referring to FIG. 1(a), in some implementations, electrochemical deposition is performed using a three-electrode cell. Initially, a graphene layer 102 is formed on a substrate 104 using, e.g., exfoliation or chemical vapor deposition. The graphene layer 102 is patterned using, e.g., electron beam lithography. A drain electrode 106 and a source electrode 108 are formed on the graphene using, e.g., electron beam lithography (EBL) and electron beam evaporation (EBE). The substrate 104, the graphene 102, and the electrodes 106, 108 are then immersed in a solution 110 in an inert container 112, in which the solution includes, e.g., phenol and sulfuric acid.

During electrochemical deposition, the drain and source electrodes 106, 108 are connected together so that the graphene 102 and the drain and source electrodes 106, 108 have the same electric potential. The graphene 102 functions as the working electrode. A voltage is applied to the drain electrode 106 through a bond wire attached to the drain electrode 106. A potentiostat 114 controls the electric potential of the graphene 102 versus a silver reference electrode 116. A platinum wire is used as the counter electrode 118.

Electrochemical deposition of poly(phenylene oxide) can be accomplished by repeatedly cycling the potential between the graphene 102 and the reference electrode 116. For example, referring to FIG. 1(d), a graph 120 shows an example in which the potential cycles between about 0.1V and 0.9V. In this example, a triangular voltage waveform can be used, and the ramp rate can be 100 mV/s. Other waveforms and ramp rates (or signal frequencies) can also be used. The graph 120 shows cyclic voltammetry (CV) of poly(phenylene oxide) deposition on a graphene device comparing the first cycle 122, second cycle 124, tenth cycle 126, and $360^{th}$ cycle 128. In this example, in the first cycle 122, the current varies from about 0.1 to −3.2 µA, in the second 124, the current varies from about 0.1 to −1.4 µA, in the tenth cycle 126, the current varies from about 0 to −0.3 µA, and in the $360^{th}$ cycle 122, the current remains about 0 µA.

In an inset, a graph 130 shows a curve 132 representing the logarithm of the current at +0.9 V plotted vs. the cycle number. The curve 132 indicates that the current becomes very small after a few hundred cycles. Poly(phenylene oxide) is non-conducting, so as more poly(phenylene oxide) is deposited on the graphene 102, the resistance becomes larger, and the current becomes smaller. As the current decreases, the deposition rate of poly(phenylene oxide) also decreases. This results in a self-limiting effect of the electropolymerization, in which the thickness of the poly(phenylene oxide) stops increasing after a certain number of cycles. The final thickness of poly(phenylene oxide) is affected by several factors, such as the concentration of phenol and sulfuric acid, the cycling potential, and the cycling frequency. The self-limiting effect also results in a self-leveling effect that results in the poly(phenylene oxide) layer having a substantially uniform thickness. During the electrochemical deposition, when there is uneven thickness in the polymer layer, the deposition of the polymer occurs faster at the thinner portions and slower at the thicker portions, eventually forming a substantially smooth and even polymer layer.

FIG. 1(b) shows the device 140 in which the conducting portions, including the graphene 102, the drain electrode 106, and the source electrode 108 are covered by poly(phenylene oxide). Referring to FIG. 1(c), a top gate 150 is formed above the poly(phenylene oxide) layer. The poly(phenylene oxide) on the drain and source electrodes 106, 108 can be removed by etching. This results in a top-gate graphene field effect transistor. In some implementations, a bottom gate 152 is formed on the backside of the substrate 104, resulting in a double-gate graphene field effect transistor.

The following describes experiments that were conducted to fabricate a top-gated graphene field effect transistor, and measurements of various characteristics of the transistor. In this example, phenol (99.5+ %, available from Sigma-Aldrich, St. Louis, Mo.) and sulfuric acid ($H_2SO_4$, 95.0-98.0%, available from EMD Chemicals, Philadelphia, Pa.) were used in the bath for electrodeposition of poly(phenylene oxide). Silicon wafers with 300 nm+/−15 nm of $SiO_2$ (available from Silicon Quest International, San Jose, Calif.) and graphite flakes (highly ordered pyrolytic graphite (HOPG), available from Sigma-Aldrich) were used to prepare graphene flakes. PMMA950 A4 (4% polymethyl methacrylate in anisole, available from MicroChem Corp., Westborough, Mass.), MMA EL6 (6% of the PMMA and ~8.5% methacrylic acid mixture in ethyl lactate, available from MicroChem Corp.), methyl isobutyl ketone:isopropanol (1:3) (MIBK:IPA, available from MicroChem Corp.), isopropanol (isopropyl alcohol (IPA), 99.5+%, available from Sigma-Aldrich), and acetone (99.7%, available from Fisher Scientific, Pittsburgh, Pa.) were used as received for electron beam lithography patterning of electrodes onto graphene. Titanium (available from International Advanced Materials, Spring Valley, N.Y.) and ¼"×¼" gold (99.999%, available from International Advanced Materials) were evaporated by using an AJA E-beam apparatus.

Graphene can be formed by two methods: graphene exfoliation and chemical vapor deposition (CVD) graphene synthesis. In the graphene exfoliation method, the tape method can be used to mechanically exfoliate graphene onto the Si/$SiO_2$ substrate. Thin flakes were found using an optical microscope and their thicknesses were determined using Raman spectroscopy.

For the chemical vapor deposition graphene synthesis, graphene films were grown by the chemical vapor deposition. 25 µm thick copper foils (available from Alfa Aesar) were cleaned in acetic acid for 10 minutes, then washed with water and IPA, dried and annealed in $H_2$ at 1000° C. for 30 minutes. Methane was then introduced to the growth chamber, and graphene was grown at 1000° C. for 15 min in a $CH_4$:$H_2$ (1:1) atmosphere at a total pressure of 550 mTorr. Upon removing the copper foil from the heating zone and quickly cooling it to room temperature, the graphene was transferred to a clean Si/$SiO_2$ substrate using a wet transfer method.

The electrodes were fabricated using the following method. MMA was spin coated on the wafers at 3000 RPM for 45 seconds. The wafers were placed on a hotplate at 180° C. for 90 seconds and cooled for 1 minute prior to adding a layer of PMMA by spin coating. The PMMA was also spin coated at 3000 RPM for 45 seconds. A Zeiss Supra 40 field-emission scanning electron microscope and a Raith pattern generator were used to form pattern electrodes on the graphene by electron beam lithography. After being exposed, the wafers were developed in the MIBK mixture for 40 seconds, rinsed with 2-propanol, and dried with nitrogen gas. The AJA E-beam system was used to evaporate titanium at 0.1 angstroms/s until a thickness of 1 nm, as measured by a quartz crystal microbalance, was achieved. Ti evaporation was followed by evaporation of 15 nm of gold at 0.1 angstroms/s. The PMMA and excess metal were removed by liftoff for 30 minutes in acetone, rinsed with isopropanol and then water, and dried with nitrogen gas. Devices were then annealed for 10 minutes at 15 mtorr and 260° C. to remove PMMA residues from the surface of the graphene.

The poly(phenylene oxide) deposition was performed using the following process. An ultrasonic welder, West Bond 7476E Manual Wedge Bonder, was used to make electrical contact between 0.0025 cm gold wires (available from Sempck) and the lithographically prepared Au/Ti contacts to the graphene. The source and drain electrodes were shorted during electrodepositions to maintain the contacts and the graphene at the same nominal potential. A CHI 1200a potentiostat was used to control the potential of the graphene working electrode versus a silver pseudoreference electrode, which exhibited a potential of +0.070 V versus the saturated calomel electrode (SCE). A platinum wire was used as the counter electrode. A silicone gasket (P-18179, 1 mm thick, available from Molecular Probes) was placed on top for the wafer, exposing 1 mm in diameter of the graphene device. A reservoir was placed on top of the gasket and fastened with copper clips and screws.

Electrochemical deposition of poly(phenylene oxide) was accomplished by repeatedly cycling the potential into the oxidation wave for phenol in 50 mM aqueous solutions of phenol dissolved in 0.5 M $H_2SO_4$. After the deposition, the wafer was rinsed with water (18 Mohm cm) and dried under a stream of nitrogen. Graphene samples were annealed under vacuum (less than 20 mTorr) inside a glass tube (1 cm in diameter) inserted through the top of a Yamato Constant Temperature Oven DKN402. The samples were annealed at 150° C. for 15 hours after which time the tubes were removed from the oven and cooled to room temperature before exposing the sample to air.

The properties of graphene were characterized using atomic force microscopy (AFM) and Raman spectroscopy. Atomic force microscopy images were collected in air using a Dimension 3100 SPM system. The atomic force microscopy was set to Tapping Mode using a silicon tip to measure thicknesses and roughness of the devices after each fabrication step. The atomic force microscopy data were analyzed using Nanoscope® Analysis. Raman spectra were recorded at ambient conditions using a DXR Raman Microscope with an excitation source of 10.0 mW at 532 nm.

The current-voltage characteristics of the field effect transistor were measured as follows. Field effect measurements were made using a Model TTPX cryogenic probe station (available from Lake Shore Cryotronics). The samples were measured under a vacuum ranging from $2 \times 10^{-6}$ to $8 \times 10^{-6}$ torr. Bottom-gated measurements were performed on the graphene FETs at various points during the fabrication process.

Top-gated graphene FETs containing thin films of poly (phenylene oxide) as the dielectric layer were constructed in several steps. A two terminal device on exfoliated graphene was patterned by electron beam lithography, and Ti/Au electrodes were deposited via electron beam evaporation. The poly(phenylene oxide) dielectric was then electropolymerized onto cleaned graphene that served as the working electrode in a 3-electrode electrochemical cell (see FIGS. 1(a) and 1(b)). Electron beam lithography and electron beam evaporation techniques were used to pattern a top electrode over the poly(phenylene oxide) (see FIG. 1(c)).

The electropolymerization of phenol to produce poly (phenylene oxide) on graphene was accomplished by continuously cycling the potential of the graphene working electrode between 0.1 and 0.9 V at a ramp rate of 100 mV/s (see FIG. 1(d)). Under these conditions a total of 360 cycles were typically completed to achieve the desired polymer thickness and uniformity. The race 122 in FIG. 1(d) shows the initial cycle in this set of 360 cycles. The peak at approximately 0.85 V is due to phenol oxidation, which leads to polymerization and passivation of the electrode. Subsequent cycles show the progressive decrease in the rate of polymerization due to the growth of a dense dielectric layer. The logarithmic inset in FIG. 1(e) gives a better indicator of passivation process after the first cycles when the oxidative current falls to a small fraction of its original value. By the 360th cycle the current falls to less than 1% of its initial value, leaving graphene with a uniform dielectric layer of poly(phenylene oxide), which was then annealed in vacuum at 150° C. for 15 hours to complete polymer crosslinking.

Referring to FIG. 1(e), optical images of the same graphene device before and after poly(phenylene oxide) deposition suggest that electropolymerization is a mild process by which the mechanical integrity of graphene and its electrical contacts can be preserved at macroscales while maintaining surface cleanliness. In FIG. 1(e), a first image 160 is an optical image of the graphene device before poly(phenylene oxide) deposition, and a second image 162 is an optical image of the same graphene device after poly(phenylene oxide) deposition.

Referring to FIG. 1(f), a graph 170 shows Raman spectra of the same monolayer graphene flake before and after poly(phenylene oxide) deposition show no detectable damage to the graphene at nanoscales. In FIG. 1(f), a curve 172 represents the spectrum of the original graphene flake, and a curve 174 represents the spectrum of graphene layer with the poly(phenylene oxide) layer. Both spectra represented by curves 172 and 174 show sharp G and 2D bands at 1586 and 2679 $cm^{-1}$ respectively, with no detectable D band around 1340 $cm^{-1}$. The shape and position of the 2D band as well as the about 1:2 G-to-2D intensity ratio are all characteristic of a monolayer graphene.

Atomic force microscopy was used to characterize the quality of the poly(phenylene oxide) films on the mesoscale. FIGS. 2(a) to 2(c) show atomic force microscopy images of a graphene FET after each fabrication step. FIG. 2(a) shows the graphene, source (S) and drain (D) electrodes before being coated with the poly(phenylene oxide) dielectric. FIG. 2(b) shows the graphene, source (S) and drain (D) electrodes after being coated with the poly(phenylene oxide) dielectric. FIG. 2(c) shows the same device after deposition of the top electrode. All three images have the same height scale. Although the edge of graphene is barely visible on the scale selected for FIG. 2(a), this edge becomes readily apparent after the deposition of poly(phenylene oxide), as shown in FIG. 2(b). The edge is prominent in FIG. 2(d), which is a section of FIG. 2(b) displayed at more sensitive length scales. These images show that poly(phenylene oxide) was selectively deposited on graphene/contacts and not over the entire substrate. FIG. 2(d) and the representative height profiles shown in FIG. 2(e) demonstrate that the poly (phenylene oxide) layer is free of pinholes on the mesoscale and that it is relatively smooth.

Referring to FIG. 3, for comparison, we provide an atomic force microscopy image 280 and a height profile 282 of a graphene/poly(phenylene oxide) sample in which mesoscale holes have been purposefully introduced. The atomic force microscopy analysis shown in FIGS. 2(a) to 2(e) does not prove the absence of pinholes on the nanoscale in the poly(phenylene oxide) layer prepared using the process described above and shown in FIGS. 1(a) to 1(c). To that end we measured leakage currents in top-gated graphene FETs and used an electrochemical technique that measures possible permeation of small molecules through thin films. In our case we used cyclic voltammetry to monitor the reduction/oxidation of a small redox probe, $Ru(NH_3)_6^{3+}$, dissolved in solution. The detailed results of such measurements, demonstrate that the poly(phenylene oxide) films effectively block electron transfer between the probe and the underlying graphene electrode, allowing us to deduce that the films are free of pinholes on a length scale of a few Angstroms, the hydrated diameter of a $Ru(NH_3)_6^{3+/2+}$ cation.

Additional insight can be gained from the height profiles in FIGS. 2(a) to 2(e). In these profiles, the height of the graphene was measured to be 1.4±0.4 nm relative to the wafer, and the height of the poly(phenylene oxide) coated graphene was measured to be 5.0±0.6 nm relative to the wafer. Thus, we estimate the poly(phenylene oxide) thickness to be 3.6±0.7 nm. In both cases the roughness measured for the wafer was approximately 0.2 nm. The uncertainties reported above are one standard deviation in the measured height. Note that we were not able to measure these height profiles at exactly the same location on the device, before and after poly(phenylene oxide) polymerization. Although the poly(phenylene oxide) thicknesses were approximately 3.6 nm under these deposition conditions, the thickness of the poly(phenylene oxide) can be controlled by controlling the deposition time through the number of cycles.

An advantage of the electropolymerization technique is the capability to selectively deposit a dielectric material only on the conductive materials connected to the potentiostat, i.e., the graphene and electrical contacts. If multiple graphene devices are present on a substrate, electrodeposition can be used to coat any specific surface or subset of surfaces that are electrically conductive.

Figure 4A:
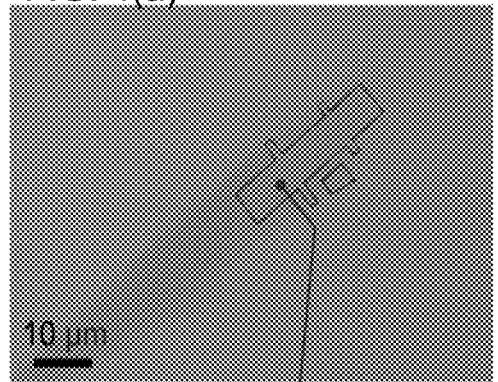
FIG. 4(a) is an optical photograph of a graphene flake on Si/SiO$_2$ substrate.
Figure 4C:
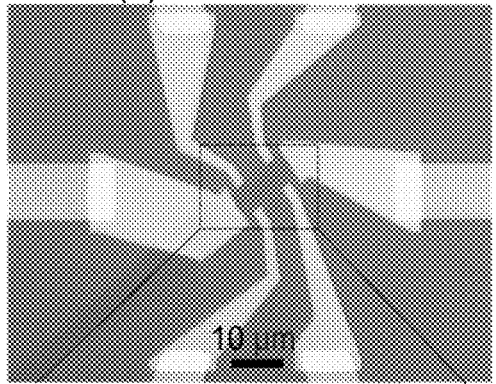
FIG. 4(c) is an optical image of a field effect transistor device fabricated from a larger graphene patch contoured in FIG. 4(a).
Figure 4B:
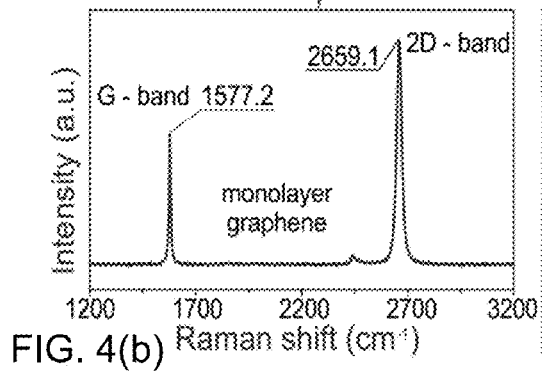
FIG. 4(b) is a graph showing a Raman spectrum of the top right region of the graphene flake shown in FIG. 4(a).
Figure 4D:
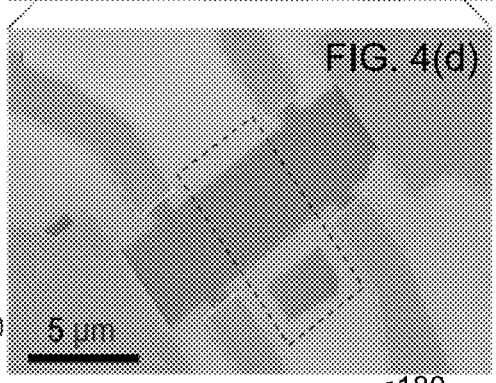
FIG. 4(d) is a scanning electron microscopy image of the same device shown in FIG. 4(c).

To demonstrate the selectivity of the electropolymerization approach, we prepared a mechanically exfoliated graphene flake on $Si/SiO_2$ substrate (FIG. 4(a)). Raman spectroscopy (FIG. 4(b)) showed that the top right part of the graphene flake was a single layer. The flake was patterned into two isolated graphene patches using electron beam lithography. The contours of these patches are outlined in FIG. 4(a). An FET device was then fabricated by electron beam lithography and electron beam evaporation using a bigger graphene patch as a conductive channel bridging the Ti/Au electrodes. The smaller graphene patch remained electrically isolated from the larger one. FIG. 4(c) shows an optical image of the device, and FIG. 4(d) shows a scanning electron microscopy (SEM) image of the device channel as well as the isolated graphene patch.

The poly(phenylene oxide) dielectric was electropolymerized onto the graphene device using the process described above and shown in FIG. 1(a). The graphene channel and the isolated graphene patch (the region outlined in FIG. 4(d)) were imaged by atomic force microscopy before and after poly(phenylene oxide) electropolymerization (see FIGS. 3(e) and 3(f), respectively). FIG. 3(g) is a graph 180 showing representative height profiles measured across the graphene channel and the isolated graphene patch. A curve 182 represents the height profile measured across the graphene channel and the isolated graphene patch before poly(phenylene oxide) electrodeposition. A curve 184 represents the height profile measured across the graphene channel and the isolated graphene patch after poly(phenylene oxide) electrodeposition. Before poly(phenylene oxide) electrodeposition, both graphene patches exhibit comparable heights, which was expected because they originated from the same monolayer graphene flake. The measured thickness for both graphene patches is about 2 nm, which is significantly larger than the interlayer distance in a graphite crystal (0.34 nm). However, prior to be characterized by atomic force microscopy, the graphene flakes were subjected to electron beam lithography and dry etching. We attribute the increased thickness to residues of PMMA used as the etch mask, solvent molecules trapped underneath the graphene, and other adsorbates.

Figure 4E:
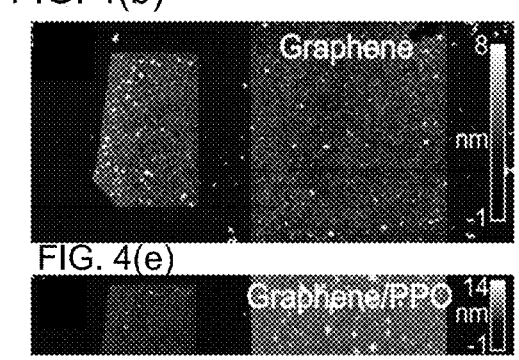
FIGS. 4(e) and 4(f) are atomic force microscopy images of the device channel and the isolated graphene patch before and after, respectively, poly(phenylene oxide) electrodeposition.
Figure 4F:
Figure 4G:
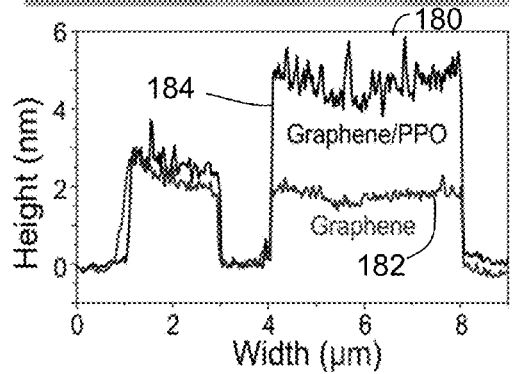
FIG. 4(g) is a graph showing height profiles of materials shown in the atomic force microscopy images of FIGS. 4(e) and 4(f).

FIG. 4(g) shows that after poly(phenylene oxide) electropolymerization the thickness of the graphene device channel serving as the working electrode increased by 3 nm. In contrast, the thickness of the isolated graphene patch, which was not biased during the electropolymerization, did not change. This result indicates that the deposition of poly(phenylene oxide) is spatially selective and occurs only on biased graphene. Considerable care was taken to assure that the control (the unbiased graphene flake) was as similar as possible to the flake onto which the poly(phenylene oxide) was deposited. Both flakes originated from the same single layer of graphene, both were subjected to the same nanofabrication procedures, and both were exposed to the same electropolymerization bath for the same period of time. One was biased; one was not. These results demonstrate the present level at which we can spatially control the deposition of poly(phenylene oxide).

To probe the electronic properties of double-gated graphene FETs with poly(phenylene oxide) top-gate dielectric, we fabricated five devices on mechanically exfoliated graphene flakes. FIGS. 5(a) to 5(g) show the results of the electrical measurements for the FET shown in FIG. 2(c). FIG. 5(a) illustrates the influence of poly(phenylene oxide) electrodeposition and top-gate fabrication on the resistivity ($\rho$) of graphene that was probed as a function of the bottom-gate voltage ($V_{BG}$). As made graphene device showed peak resistivity of 2.7 k$\Omega$/□ at the Dirac point ($V_{Dirac}$), approximately −12 V. Graphene field-effect mobility ($\mu_{FE}$) was estimated by selecting linear regime of the transport curve and fitting it with Equation 1:

$$\mu_{FE} = \frac{1}{C_{BG}} \times \frac{d(1/\rho)}{dV_{BG}} \quad \text{(Equ. 1)}$$

The resulting value, $\mu_{FE}$=1290 cm$^2$/Vs, is consistent with values described in literature for graphene on $SiO_2$.

After poly(phenylene oxide) electrodeposition and top-gate fabrication the resistivity increased slightly to 3.1 k$\Omega$/□, and the $V_{Dirac}$ shifted to approximately 4 V, indicating p-doping of graphene by poly(phenylene oxide). To estimate the graphene mobility, we used $\rho$ vs. $V_{BG}$ dependence when top-gate electrode was grounded (dashed curve 190 in FIG. 5(a)). In this case the effective capacitance is equal to back-gate capacitance. Again using Equation 1, we estimate the mobility after top-gate electrode fabrication to be 335 cm$^2$/Vs. Measurements for mobility before and after poly(phenylene oxide) deposition for five additional devices were made. Overall, the change in mobility is moderate and consistent for all samples examined.

FIG. 5(b) shows resistivities at $V_{Dirac}$ for six graphene devices—one of which (sample 1) is depicted in FIGS. 2(a) to 2(c)—before and after electrodeposition of the poly (phenylene oxide) top dielectric. Measurements for five additional devices were made. Resistivities for the uncoated graphene range from 2 to 7 k$\Omega$/□, and with one exception (sample 5) little change in resistivity is observed upon deposition of the poly(phenylene oxide). Overall, the change in resistivity is minor and it is consistent with the Raman spectroscopy, which indicates that the electropolymerization is a mild process.

Device performance as an FET is provided in FIG. 5(c), which is a resistivity map as a function of the top-gate voltage ($V_{TG}$) and $V_{BG}$. Resistivity vs. $V_{TG}$ dependence in 0.01 V increments was measured individually for each bottom gate voltage from −50 to 50 V in 1V increments. The measurements were performed at room temperature. The figure shows that the resistivity of a graphene FET can be independently tuned by either gate and the peak resistivity appears at approximately $V_{BG}$=12 V and $V_{TG}$=−0.15 V.

Several cross-sections of the resistivity map shown in FIG. 5(c) are plotted in FIGS. 5(d) to 5(f). FIG. 5(d) shows the dependence of resistivity on gate voltage when voltage was applied to one gate (top or bottom) but the other was grounded (i.e., a cross-section at $V_{TG}$=0 and $V_{BG}$=0 respectively). This figure shows that the ambipolar field-effect behavior typical for graphene can be observed when either gate is applied. The leakage current through the top gate dielectric was 1.9 nA at $V_{TG}$=−0.3 V (FIG. 5(d), insert), indicating that the top gate does not penetrate through the poly(phenylene oxide) to the graphene.

Cross-sections of the resistivity map shown in FIGS. 5(e) and 5(f) help to illustrate the shift of $V_{Dirac}$ when voltage is applied to each gate electrode. FIG. 5(e) shows the dependence of resistivity on $V_{BG}$ when $V_{TG}$ is varied from −0.15 to 0.2 V in 0.05 V increments. A shift of the $V_{Dirac}$ is negligible (also shown on FIG. 5(c) as dashed line 194) and is due to performance of graphene device over the area not covered by the top-gate electrode. FIG. 5(f) shows the dependence of graphene resistivity on $V_{TG}$ when $V_{BG}$ is varied from −50 to 10 V in 5 V increments. In this case $V_{Dirac}$ shifts toward more negative values when $V_{TG}$ increases, as illustrated by the arrow 192 in FIG. 5(f) and marked by a solid line 196 in FIG. 5(c). This change is associated with the graphene area covered by the top-gate electrode. Since the top-gate electrode covers only a small area of graphene device (see FIG. 2(c)), the shift in $V_{Dirac}$ is observed only when the dependence of graphene resistivity on $V_{TG}$ is examined at various $V_{BG}$.

FIG. 5(f) shows that for different values of $V_{BG}$ the Dirac point is observed at different top-gate voltages. This dependence of $V_{Dirac}$ on both top- and bottom-gate voltages is further illustrated in FIG. 5(g). For each experimentally selected $V_{BG}$, this figure shows the corresponding $V_{TG}$ at which the maximum resistivity is observed. $V_{Dirac}$ corresponds to the charge neutrality point that is reached when a certain charge, q, is induced in graphene by applying either or both top- and bottom-gate voltages as described in Equation 2:

$$q = C_{TG} \cdot V_{TG} + C_{BG} \cdot V_{BG} \quad \text{(Equ. 2)}$$

where $C_{TG}$ and $C_{BG}$ correspond to the top- and bottom-gate capacitances, respectively. The relationship between the two independent parameters, $V_{TG}$ and $V_{BG}$ (at $V_{Dirac}$) can be expressed by the algebraic rearrangement of Equation 2, as shown in Equation 3:

$$V_{TG} = \frac{q}{C_{TG}} - \frac{C_{BC}}{C_{TG}} V_{BG} \quad \text{(Equ. 3)}$$

This simple model is consistent with our experimental results, which show a linear relationship between $V_{TG}$ and $V_{BG}$ at $V_{Dirac}$. From the slope of a fit to these data, i.e., from the $C_{BG}/C_{TG}$ ratio, we estimate that $C_{TG} \approx 137 \cdot C_{BG}$. The back-gate capacitance of this configuration is estimated to be about 11.5 nF/cm², using a $SiO_2$ thickness of 300 nm and k≈3.9. Thus, we estimate the top-gate capacitance to be 1580 nF/cm².

Due to its high quality, mechanically exfoliated samples are typically used to characterize the intrinsic properties of graphene, while CVD-grown graphene are often the material of choice for large-scale applications. We have used CVD-grown graphene to provide additional evidence for the reliability and reproducibility of poly(phenylene oxide) electropolymerization on graphene. Furthermore, we show the feasibility of implementing the procedure to deposit the poly(phenylene oxide) dielectric on a large number of graphene FETs in a single step.

FIG. 6(a) shows the scheme of the device fabrication. First, large-scale monolayer graphene was grown by chemical vapor deposition on copper and transferred to a $Si/SiO_2$ substrate 200. The graphene thickness was confirmed by Raman spectroscopy. Using electron beam lithography and dry etching with PMMA serving as an etch mask material, we then patterned an array of eight graphene strips 202 as shown in FIG. 6(a)(i). A second set of electron beam lithography and electron beam evaporation steps were executed to fabricate Ti/Au electrodes 204, resulting in an array of eight graphene FETs, as depicted in FIG. 6(a)(ii). All graphene devices in this array shared common contact (S), which is also served as the contact to the working electrode 206 of a 3-electrode potentiostat. The potentiostat was used to electrodeposit poly(phenylene oxide) on all eight graphene FETs in a single step (FIG. 6(a)(iii)). Top-gate electrodes for all eight graphene FETs were then fabricated in a final set of electron beam lithography and electron beam evaporation steps, as shown in FIG. 6(a)(iv).

FIG. 6(b) shows a photograph 210 of the resulting array of double-gated graphene FETs with a common source (S) 212 and bottom gate (BG), but separate top-gate (TG) electrodes 214. FIG. 6(c) shows a photograph 220 of one device in the array at higher magnification. Atomic force microscopy analysis shows that thin poly(phenylene oxide) layers were successfully deposited on all eight graphene channels.

Representative atomic force microscopy images of the same graphene FET channel before and after poly(phenylene oxide) electropolymerization are shown in FIGS. 6(d) and 6(e), respectively. The atomic force microscopy image of poly(phenylene oxide)-coated CVD graphene shows evidence of surface contamination, but this contamination is not due to the poly(phenylene oxide) electrodeposition. Features in similar locations with similar height profiles are observed in atomic force microscopy images acquired before poly(phenylene oxide) deposition. It appears that this contamination occurred sometime during transfer of the CVD graphene from the copper foil to $Si/SiO_2$, or that it is due to PMMA residues remaining from one or more of the lithographic steps. We observed these particulates in all atomic force microscopy images of CVD graphene samples but not for mechanically exfoliated samples, suggesting more strongly that the presence of the particles occurs during CVD graphene transfer.

FIG. 6(f) shows representative height profiles measured across the graphene channel in FIGS. 4(e) and 4(f), demonstrating that the thickness of the layer of electrodeposited poly(phenylene oxide) is about 5 nm. No discernible differences in average thickness were observed between different channels.

FIG. 6(g) shows the comparison of drain-source current ($I_{DS}$)-gate voltage dependences for one of the devices in the array (FIG. 6(b)); the curves measured when only one gate voltage (top or bottom) was applied. Similar to the devices based on mechanically exfoliated graphene (FIG. 5(d)), this figure shows that the ambipolar field-effect behavior could observed for the double-gated FETs based on CVD-grown graphene when either gate is applied.

To demonstrate the reliability and reproducibility of the top gate fabrication using electrodeposited poly(phenylene oxide) as the gate dielectric material, we compare the dependence of $I_{SD}$ on $V_{TG}$ for all eight graphene FETs in the array (FIG. 6(h)). Each device was gated using an individual top gate electrode. The position of the Dirac point varies from device to device, which we attribute to subtle differences in the properties of the CVD-grown graphene. Similar variabilities have been attributed to differences in defect concentrations, which manifest themselves in changed relative intensities of the G, D and 2D Raman bands.

The quality of the electrodeposited poly(phenylene oxide) films was assessed by measuring the dependence of the leakage current on $V_{TG}$ for all graphene FETs in the array. All devices showed a qualitatively similar dependence of the leakage current on $V_{TG}$, (see FIG. 6(i)) where five curves are shown), but the absolute values of the leakage current varied over several orders of magnitude. One of the graphene devices in the array exhibited exceptional dielectric properties showing a leakage current of only about $10^{-12}$ amps across the poly(phenylene oxide) at Vg=300 mV (see the curve 250 in FIG. 5(i)). Four devices shown exhibited a higher leakage current of about $10^{-8}$ A at Vg=300 mV, and three other devices (not shown) passed about $10^{-7}$ A at Vg=300 mV. Our results show that low leakage currents can be obtained for double-gated FETs constructed on mechanically exfoliated graphene and on CVD-grown graphene, demonstrating the utility of the poly(phenylene oxide) electropolymerization technique for introducing the top dielectric. Recent advances in cleaner transfer of CVD graphene from copper substrates may help decrease the leakage currents in arrays of double-gated graphene FETs containing electrodeposited poly(phenylene oxide) as the top-gate dielectric.

The positive potentials used to oxidatively polymerize phenol may have a negative impact on the integrity of the graphene, if the potentials are too high. We have observed degradation of graphene at potentials positive of the onset of phenol oxidation in sulfuric acid. If the potential is cycled to +1.1 V instead of the usual +0.9 V required to polymerize phenol, pores may develop in the graphene. When phenol is also present in the bath, the polymerization competes with pore formation, but the passivation does not dominate until pores grow to sizes that can be as large as 100 nm in diameter. It may be possible to use this process to control pore size and pore density in graphene thus forming graphene nanomeshes with a tunable electronic band gap.

The process for electro-polymerization of phenol to produce effective dielectric barriers on graphene may be further optimized. Several factors may influence the properties of the polymer dielectric, including the rate at which the polymer is electrodeposited, the monomer concentration in solution, the solution pH, and the identity of the solvent.

Additional organic thin films may be prepared by electropolymerizing other monomers such as 4-chlorophenol, 2,6-dimethylphenol, and o-phenylenediamine. The polymer is generally linked between the oxygen (the 1-position) on one ring and the 2-, 4-, and 6-positions (relative to the phenol group) on the other ring. Consequently, complex structures can result if these positions are not blocked. For 2,6-dimethyphenol, coupling can occur between the 1- and 4- positions to give polymers that are nominally linear. The bath used for the electrochemical deposition can include a solvent that can dissolve (or partially dissolved) the electrolyte and dissolve (or partially dissolve) the monomer. The solvent can be water or a solvent that can ionize (dissociate) the electrolyte at sufficient levels to allow current to flow. The pH can be acidic, neutral, or basic. The solvents include, e.g., methanol and acetonitrile. Solvent mixtures can also be used.

Further improvement of the device fabrication may include using electrodeposited low-κ dielectrics as the seed layer on graphene for depositing high-κ dielectrics by ALD. By replacing the metal top-gate, the source, and the drain with conducting polymers such as poly(3,4-ethylenedioxythiophene) (PEDOT) that can be spin-coated, it may be possible to construct organic flexible electronic devices.

To verify whether there are pinholes in the poly(phenylene oxide) fabricated using the electrochemical deposition process, one can perform cyclic voltammetry on a redox couple. If the pinholes in a thin film passivating an electrode are close together, the shape of the cyclic voltammetry for a dissolved redox couple resembles the shape of the cyclic voltammetry for the same redox couple at a bare electrode, but with a smaller peak current. If the pinholes are spaced far enough apart such that their diffusion layers do not overlap during the potential sweep, then the cyclic voltammetry waveshape for a dissolved redox couple resembles the waveshape for a steady-state mass transfer limited voltammogram. The pinholes act as a collection of ultramicroelectrodes, where the diffusion layer thickness is large compared to the size of the ultramicroelectrode (pinhole). If there are no pinholes within the film, then there is no Faradaic current during the potential sweep.

Figure 7A:
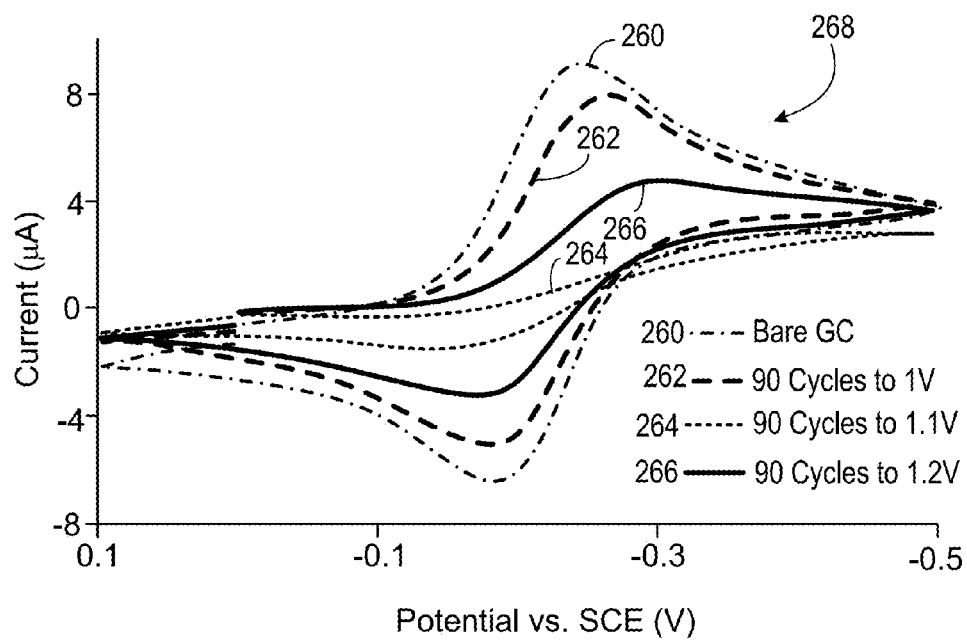
FIG. 7A is a graph showing a comparison of the poly(phenylene oxide) films prepared from the aqueous solution containing 50 mM phenol and 0.5 M $H_2SO_4$ with 90 potential cycles to different maximum potentials in $Ru(NH_3)_6^{3+}$ solution.
Figure 7B:
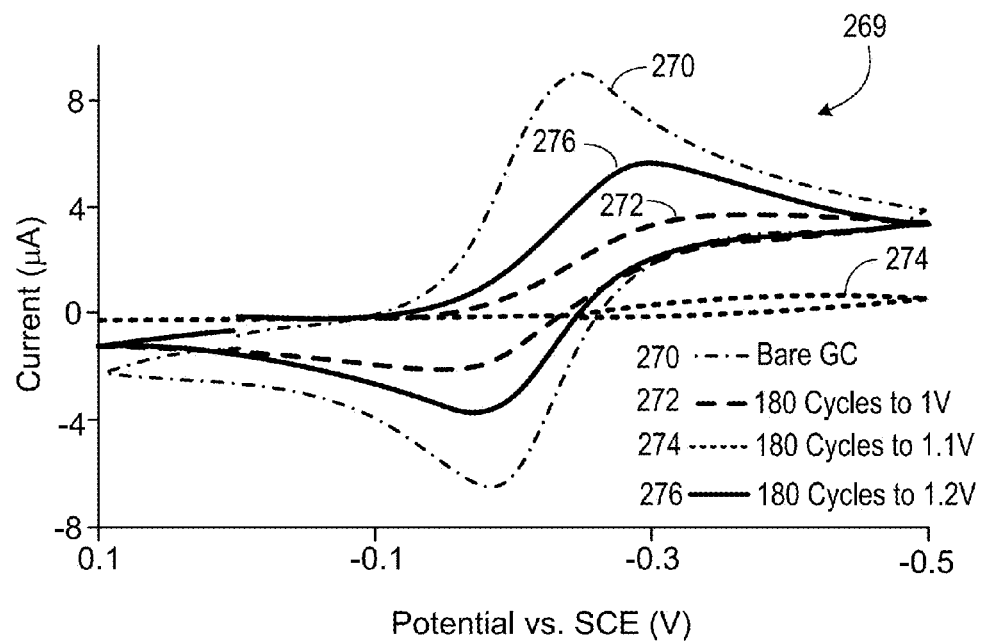
FIG. 7B is a graph showing a comparison of the poly(phenylene oxide) films prepared from the aqueous solution containing 50 mM phenol and 0.5 M $H_2SO_4$ with 180 potential cycles to different maximum potentials in $Ru(NH_3)_6^{3+}$ solution.

FIGS. 7A and 7B show cyclic voltammetry of an aqueous solution containing 5 mM hexaammineruthenium(III) chloride ($Ru(NH_3)_6Cl_3$) and 1 M potassium chloride (KCl) at a glassy carbon electrode with and without poly(phenylene oxide). $Ru(NH_3)_6^{3+}$ has a hydrated radius of 0.64 nm at 22° C. The poly(phenylene oxide) was deposited using a variety deposition conditions. The maximum switching potential of the working electrode and number of potential cycles used during the deposition of poly(phenylene oxide) were adjusted to determine the optimum conditions for the production of pinhole free films. FIG. 7A shows a graph 268 that compares poly(phenylene oxide) films prepared by cycling the potential 90 times between the following potentials: 0 V to 1 V (curve 262), 0 V to 1.1 V (curve 264), and 0 V to 1.2 V (curve 266). Curve 260 is the cyclic voltammetry curve of bare graphene without poly(phenylene oxide). As indicated by curve 264, the deposition with a maximum switching potential of 1.1 V vs. SCE resulted in the lowest reduction peak current for the $Ru(NH_3)_6^{3+}$, and the voltammogram approaches the shape expected for steady state mass transfer. This indicates that the pinholes in the film are separated by large distances and that the diffusion layers of the pinholes do not overlap.

FIG. 7B shows a graph 269 illustrating the same cyclic voltammetry comparison but with poly(phenylene oxide) films deposited onto the electrode with 180 potential cycles between the following potentials: 0 V to 1 V (curve 272), 0 V to 1.1 V (curve 274), and 0 V to 1.2 V (curve 276). Curve 270 is the cyclic voltammetry curve of bare graphene without poly(phenylene oxide). Again, as indicated by curve 274, films prepared using a maximum switching potential of 1.1 V resulted in the lowest reduction peak current. The film prepared with 90 potential cycles does not passivate the electrode as well as the 180 potential cycles and indicates that more potential cycles are needed to improve the film passivation.

Without wishing to be bound by the theory presented herein, the following is a possible explanation of the differences in the degree of passivation that arises when different poly(phenylene oxide) deposition voltages are used. Poly(phenylene oxide) films deposited at mild potentials may act as transport barriers but not as well as the films prepared at highly anodic potentials. At highly positive potentials, additional polymerization mechanisms may further oxidize the films to produce cross-linked structures. The decrease in the barrier effectiveness when 1.2 V is applied may be due to film decomposition. Further passivation of electrodes may be observed after annealing the films at 150° C. in vacuum. The increase in passivation may be due to crosslinking within the film or chain reorganization and packing effects.

Figure 8:
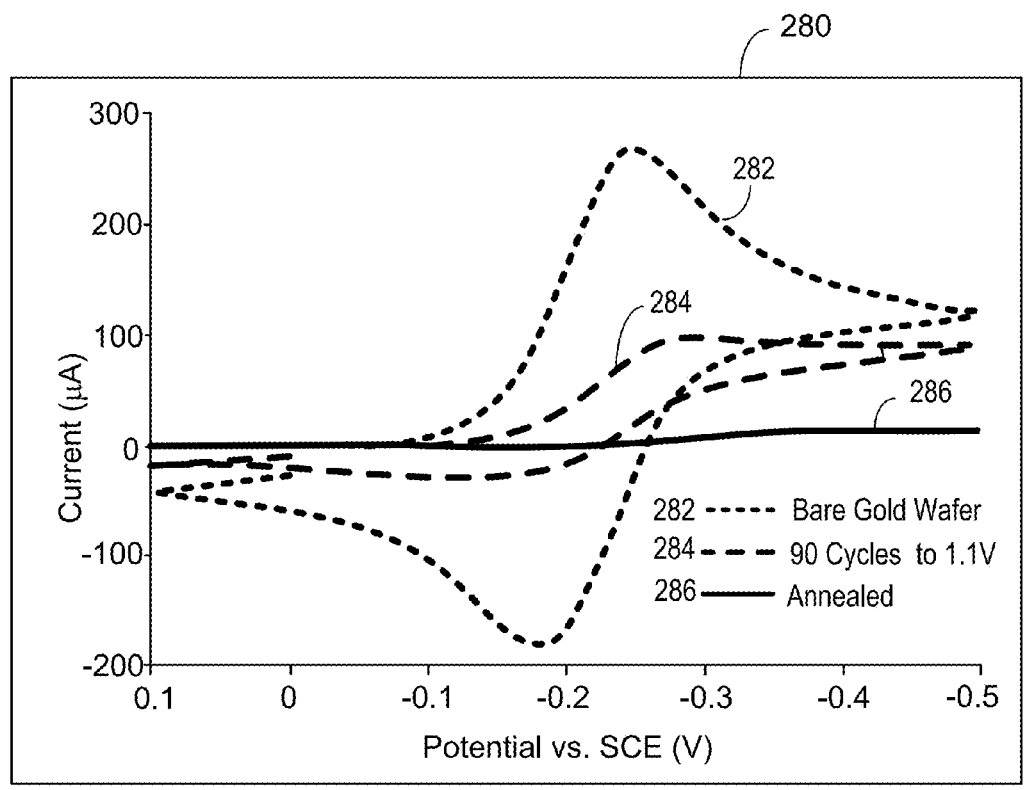
FIG. 8 is a graph showing cyclic voltammetry characterization of the poly(phenylene oxide) film grown on a gold wafer before and after annealing.

FIG. 8 shows a graph 280 that compares voltammetric responses to 5 mM $Ru(NH_3)_6^{3+}$ at a bare Au coated wafer (curve 282), after poly(phenylene oxide) deposition (90 potential cycles from 0 V to 1.1 V) on a gold coated wafer (curve 284), and after annealing the wafer at 150° C. for 15 hours in vacuum (curve 286). The electrode area available to the solution is much smaller at the poly(phenylene oxide) coated electrode than at the bare Au wafer, but it is clear that the passivating layer does not completely block the redox species from reaching the electrode surface. The electrode appears fully blocking to 5 mM $Ru(NH_3)_6^{3+}$ after annealing the wafer.

FIGS. 9(a) to 9(e) show optical images (scale bar is 10 μm) and transfer characteristics for 5 devices before and after poly(phenylene oxide) deposition. FIG. 9(f) is a graph 290 showing mobility values for graphene devices presented in FIGS. 9(a) to 9(c) as well as sample #1 in FIG. 5 before and after poly(phenylene oxide) deposition.

Figure 10:
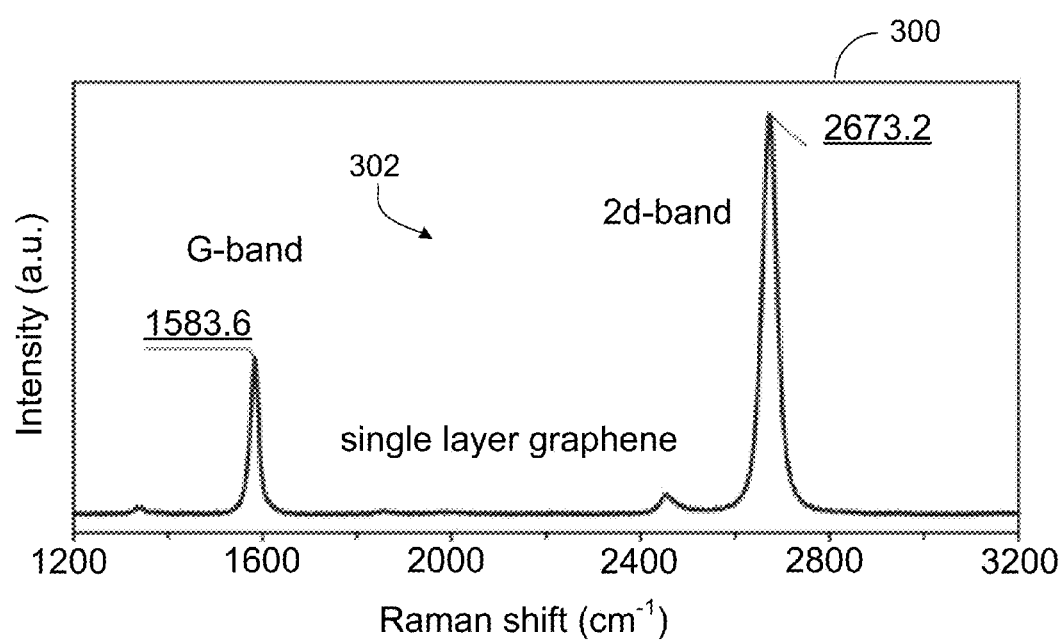
FIG. 10 is a graph showing a Raman spectrum of a single layer graphene on $Si/SiO_2$ wafer using chemical vapor deposition.

FIG. 10 is a graph 300 showing a Raman spectrum 302 of a single layer graphene on a $Si/SiO_2$ wafer that is used fabricate graphene device array in FIG. 5(b). The graphene was grown using chemical vapor deposition.

Figure 11:
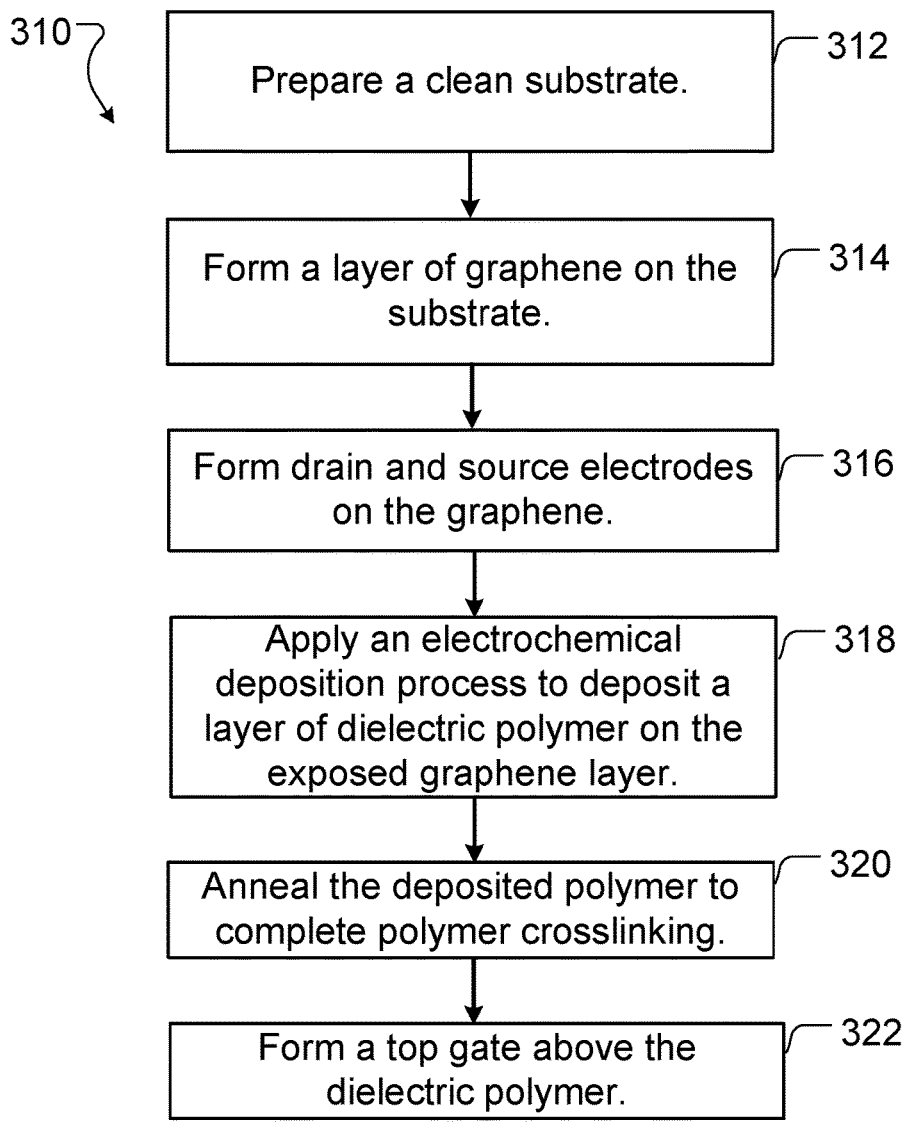
FIG. 11 is a flow diagram of a process for fabricating a top-gated graphene field effect transistor.

FIG. 11 shows a flow diagram of a process 310 for fabricating a top-gated graphene field effect transistor. A clean substrate is prepared 312. The substrate can be, e.g., a silicon substrate having a thin layer of silicon dioxide. A layer of graphene is formed on the substrate 314. The graphene can be formed by, e.g., the exfoliation method of by chemical vapor deposition. The graphene layer can be patterned using, e.g., electron beam lithography.

Drain and source electrodes are formed on the graphene layer 316. For example, the drain and source electrodes can be formed on the graphene using electron beam lithography and electron beam evaporation. The drain and source electrodes can be made of gold and titanium.

An electrochemical deposition process is applied to deposit a layer of dielectric polymer on the exposed graphene layer 318. The electrochemical deposition can be performed using a three-electrode cell. For example, the graphene may be placed in a solution that includes phenol and sulfuric acid. The electro-oxidation of phenol results in poly(phenylene oxide) being deposited on the graphene. A potentiostat can be used to control the potential of the graphene versus a reference electrode, and the potential is cycled between a lower potential and a higher potential. For example, the lower potential can be less than 0.5V, and the higher potential can be in a range from 0.5V to 1.2V. In some examples, the potential can be cycled between about 0.1V to 0.9V. The process may include cycling the potential for a few hundred cycles. The dielectric polymer can have a thickness of, e.g., less than 10 nm.

The device is annealed to complete polymer crosslinking 320. For example, the device can be annealed in vacuum at 150° C. for 15 hours. A top gate is formed above the polymer 322. The top gate can be made of metal.

Figure 12:
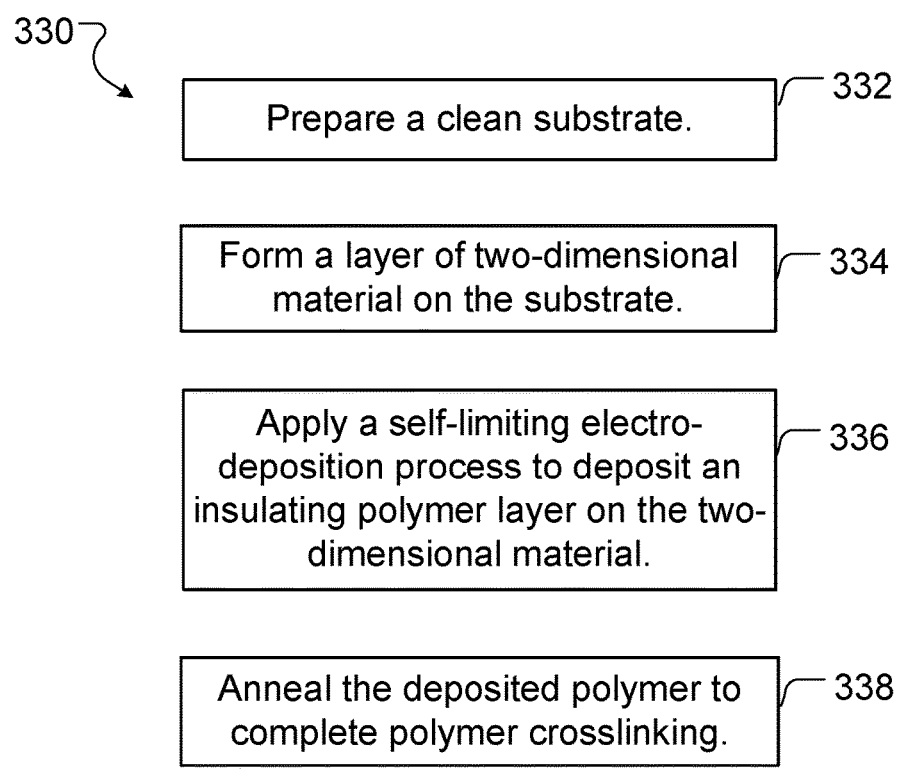
FIG. 12 is a flow diagram of a process for forming a layer of polymer on a two-dimensional material.

FIG. 12 shows a flow diagram of a process 330 for forming a layer of polymer on a two-dimensional material. A clean substrate is prepared 332. A layer of two-dimensional material is formed on the substrate 334. For example, the two-dimensional material layer can have a thickness less than 10 nm. The two-dimensional material can be, e.g., graphene or phosphorene. The graphene can be monolayer graphene.

A self-limiting electro-deposition process is applied to deposit a polymer layer on the two-dimensional material 336. In this example, the polymer is an insulator, and a rate of deposition of the polymer at a given location of the two-dimensional material decreases as a thickness of the polymer layer increases. For example, the electro-deposition process can be an electrochemical deposition performed using a three-electrode cell. For example, the two-dimensional material may be placed in a solution that includes phenol and sulfuric acid. The electro-oxidation of phenol results in poly(phenylene oxide) being deposited on the two-dimensional material. A potentiostat can be used to control the potential of the two-dimensional material versus a reference electrode, and the potential is cycled between a lower potential and a higher potential. For example, the lower potential can be less than 0.5V, and the higher potential can be in a range from 0.5V to 1.2V. In some examples, the potential can be cycled between about 0.1V to 0.9V. The process may include cycling the potential for a few hundred cycles. The polymer can have a thickness of, e.g., less than 10 nm.

The device is annealed to complete polymer crosslinking 338.

A field effect transistor can be fabricated using the two-dimensional material and polymer layer. For example, the two-dimensional material may be patterned to form a channel of the field effect transistor. Drain and source electrodes may be formed on the two-dimensional material. A top gate can be formed above the polymer layer, in which the polymer layer functions as the top gate dielectric layer.

In some implementations, a system for fabricating an integrated circuit that includes graphene transistors includes an electrochemical deposition module to form a dielectric polymer on a graphene layer using the process described above. The system includes a controller that controls a potentiostat to control the cycling of electric potential applied to the working and reference electrodes. The system includes an input device (which may include, e.g., a display, a keyboard, and a pointing device such as a computer mouse) for allowing a user to specify a desired thickness of the dielectric polymer. The system includes a storage device (e.g., hard drive, solid state memory, or dynamic random access memory) that stores a table that has information about a mapping between the number of cycles and a thickness of the deposited polymer film, under each of various conditions, such as different upper and lower potentials, temperatures, pH values. The mapping information is established based on past experiments or trials. Thus, for given upper and lower potentials, temperature, and pH value, an operator can use the input device to select a desired thickness for the polymer film, and the controller will access the table to determine the number of cycles needed to achieve the desired thickness, and control the potentiostat accordingly.

The controller may include a programmable system having at least one programmable processor coupled to receive data and instructions from, and to transmit data and instructions to, a data storage system for storing data and instructions. The at least one programmable processor can include, e.g., general purpose microprocessors, special purpose microprocessors, or digital signal processors.

Although some examples have been discussed above, other implementations and applications are also within the scope of the following claims. For example, electrochemical polymerization of various phenolic compounds on graphene or other two-dimensional materials is possible. Hydroxy substituted aryl compounds (or multiply hydroxy substituted aryl compounds) may be polymerized. Monomers that can be used in the electrochemical polymerization process include, e.g., 4-methylphenol (ρ-cresol), 1-napthol, 4-phenylphenol, 8-hydroxyquinonline, bis(2-hydroxy-phenyl) methane, and 1,3,5-trihydroxybenzene. For example, electrochemical polymerization of 2,6-diphenylphenol to produce thin films of poly(2,6-diphenylphenylene oxide) is possible. Electropolymerizations can be performed using solutions prepared by dissolving anthrone under basic conditions. Keto-enol tautomerism of anthrone to the phenolate resonance structure occurs at pH>7.9, in which the phenolate resonance structure can be electropolymerized to produce a polymer that may adsorb strongly on graphene and other highly aromatic carbon substrates.

The conditions for electrochemical deposition can be different from those described above. In the electrochemical deposition process, the potential between the working electrode (e.g., the graphene layer) and the reference electrode does not necessarily have to cycle between a low potential and a high potential. In some implementations, the potential can be maintained at a fixed value throughout the electrochemical deposition process. In some implementations, the potential can be varied slowly from a low value to a high value, without cycling back to the low value.

Two-dimensional materials other than those described above can be used, such as $MoS_2$, $WSe_2$, $NbSe_2$, and $TaS_2$.

In the example of FIGS. 2(a) to 2(e), the thickness of the poly(phenylene oxide) layer is about 3.5 nm, less than 4 nm. Such a thin layer of gate dielectric is useful in a transistor device. In some implementations, a thicker dielectric polymer may be deposited on graphene or other two-dimensional materials. For example, the dielectric polymer may be used to protect the graphene or other two-dimensional materials, e.g., from oxidation. In such examples, the thickness of the dielectric polymer may be 500 nm, 1 μm, or thicker. The larger thickness may be achieved by using a different solution for the electrochemical deposition bath, or by changing the pH value of the solution.

Phosphorene may be used in two-dimensional semiconductor devices, which can be used in displays or other electronic devices. Because phosphorene is thin, the resulting devices or displays can be flexible.

Using electropolymerization to deposit a thin polymer on graphene is useful for various graphene devices, such as graphene sensors, graphene p-n junctions, displays that use graphene, or memory devices that use graphene. In general, the technique can be used in any application where it is useful to have a dielectric layer or a passivating layer on graphene. In some implementations, the polymers can be deposited on nanoscale (or mesoscale) crystals or spheres.

What is claimed is:

1. A method of fabricating a graphene transistor, the method comprising:
    forming a layer of graphene on a substrate;
    applying an electrochemical deposition process to deposit a layer of dielectric polymer on the graphene layer;
    forming a layer of second dielectric material on the dielectric polymer layer, the second dielectric material having a dielectric constant that is higher than the dielectric constant of the polymer; and
    forming a top gate above the layer of second dielectric material.

2. The method of claim 1 in which a potential between the graphene layer and a reference electrode is cycled between a lower potential and a higher potential.

3. The method of claim 2 in which the lower potential is in a range between 0 to 0.5V, and the higher potential is in a range between 0.5V to 1.5V.

4. The method of claim 1 in which depositing the layer of dielectric polymer comprises depositing poly(phenylene oxide) on the graphene.

5. The method of claim 1, comprising patterning the graphene to form a channel, and forming drain and source electrodes that are electrically coupled to the graphene.

6. The method of claim 1 in which applying an electrochemical deposition process comprises placing the graphene and the substrate in a solution that includes phenol and sulfuric acid.

7. The method of claim 1 in which depositing a layer of dielectric polymer comprises depositing a layer of dielectric polymer having a thickness that is less than 10 nm.

8. A method comprising:
    forming a layer of two-dimensional material on a substrate, the two-dimensional material layer having a thickness less than 1 μm;
    applying an electro-deposition process to deposit a dielectric polymer layer on the two-dimensional material, in which a rate of deposition of the polymer at a given location of the two-dimensional material decreases as a thickness of the polymer layer increases; and
    forming a layer of dielectric material on the polymer layer, the dielectric material having a dielectric constant that is higher than the dielectric constant of the polymer layer.

9. The method of claim 8 in which the two-dimensional material has a thickness less than 100 nm.

10. The method of claim 8 in which the two-dimensional material has a thickness less than 10 nm.

11. The method of claim 8 in which the two-dimensional material comprises graphene.

12. The method of claim 8, comprising patterning the graphene to form a channel of a field effect transistor, forming drain and source electrodes that are electrically coupled to the graphene, and forming a top gate above the polymer layer.

13. The method of claim 8 in which applying an electro-deposition process comprises causing the two-dimensional material to be in contact with a solution that includes phenol and sulfuric acid, and applying a potential between the two-dimensional material and a reference electrode to deposit a layer of poly(phenylene oxide) on the two-dimensional material.

14. The method of claim 13 in which applying a potential comprises cycling a potential between the two-dimensional material and a reference electrode between a lower potential and a higher potential, the lower potential being less than 0.5V, and the higher potential being in a range from 0.5V to 1.5V.

15. The method of claim 14 in which applying the potential comprises cycling the potential between the graphene and the reference electrode between about 0.1 V to about 0.9V.

16. The method of claim 13 in which forming a layer of two-dimensional material comprising forming a graphene layer having a thickness less than 3 nm, and depositing a polymer layer comprises depositing a polymer layer having a thickness less than 10 nm.

17. The method of claim 8 in which forming the layer of dielectric material comprise using atomic layer deposition to deposit the layer of dielectric material.

18. The method of claim 8, comprising forming pores in the graphene layer when applying the electro-deposition.

19. The method of claim 8 in which applying an electro-deposition process comprises electro-polymerizing one or more monomers that include at least one of 4-chlorophenol, 2,6-dimethylphenol, or o-phenylenediamine.

20. The method of claim 8 in which forming a layer of two-dimensional material comprises forming a layer of phosphorene.

21. The method of claim 20, comprising covering the phosphorene layer with the polymer layer to prevent oxidation of the phosphorene.

22. A method comprising:
forming a layer of two-dimensional material on a substrate;
performing electrochemical polymerization of phenol to form a layer of polymer on the two-dimensional material, the polymer comprising poly(phenylene oxide); and
forming a layer of dielectric material on the polymer layer, the dielectric material having a dielectric constant that is higher than the dielectric constant of the polymer layer.

23. The method of claim 22 in which forming a layer of two-dimensional material comprises forming a layer of graphene.

24. The method of claim 23, comprising patterning the graphene to form a channel of a field effect transistor, forming drain and source electrodes on the graphene, and forming a top gate on the polymer layer.

25. The method of claim 22 in which performing electrochemical polymerization of phenol comprises applying an alternating voltage or current to a solution that includes phenol and sulfuric acid.

26. The method of claim 22 in which forming a layer of two-dimensional material comprises forming a layer of phosphorene.

* * * * *